(12) United States Patent
Yamazaki

(10) Patent No.: US 7,422,987 B2
(45) Date of Patent: Sep. 9, 2008

(54) METHOD FOR MANUFACTURING SEMICONDUCTOR DEVICE

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 123 days.

(21) Appl. No.: 11/525,822

(22) Filed: Sep. 25, 2006

(65) Prior Publication Data

US 2007/0020826 A1    Jan. 25, 2007

Related U.S. Application Data

(62) Division of application No. 10/224,628, filed on Aug. 21, 2002, now Pat. No. 7,132,375.

(30) Foreign Application Priority Data

Aug. 30, 2001    (JP)    ............... 2001-262356

(51) Int. Cl.
*H01L 21/26* (2006.01)
*H01L 21/324* (2006.01)
*H01L 21/42* (2006.01)
*H01L 21/477* (2006.01)

(52) U.S. Cl. ............ 438/795; 438/149; 438/150; 438/166; 438/308; 438/487; 257/E21.094

(58) Field of Classification Search ............... 438/149, 438/150, 151, 164, 166, 308, 487, 795
See application file for complete search history.

(56) References Cited

U.S. PATENT DOCUMENTS 4,309,225 A    1/1982    Fan et al.

(Continued)

FOREIGN PATENT DOCUMENTS

EP    0 878 789 A2    11/1998

(Continued)

OTHER PUBLICATIONS

"Office Action (U.S. Appl. No. 10/238,050) mailed Dec. 23, 2005".

(Continued)

*Primary Examiner*—Scott B. Geyer
*Assistant Examiner*—Seahvosh J Nikmanesh
(74) *Attorney, Agent, or Firm*—Nixon Peabody LLP; Jeffrey L. Costellia

(57) ABSTRACT

It is an object of the invention to provide a technique forming a crystalline semiconductor film whose orientation is uniform by control of crystal orientation and obtaining a crystalline semiconductor film in which concentration of an impurity is reduced. A configuration of the invention is that a first semiconductor region is formed on a substrate having transparent characteristics of a visible light region, a barrier film is formed over the first semiconductor region, a heat retaining film covering a top and side surfaces of the first semiconductor region is formed through the barrier film, the first semiconductor region is crystallized by scanning of a continuous wave laser beam from one edge of the first semiconductor region to the other through the substrate, the heat retaining film and the barrier film are removed, then a second semiconductor region is formed as an active layer of TFT by etching the first semiconductor region. A pattern of the second semiconductor region formed by etching is formed in a manner that a scanning direction of the laser beam and a channel length direction of the TFT are arranged in almost the same direction in order to smooth drift of carriers.

48 Claims, 24 Drawing Sheets

U.S. PATENT DOCUMENTS

| | | | |
|---|---|---|---|
| 4,330,363 | A | 5/1982 | Biegesen et al. |
| 4,400,715 | A | 8/1983 | Barbee et al. |
| 4,536,231 | A | 8/1985 | Kasten |
| 4,822,752 | A | 4/1989 | Sugahara et al. |
| 5,336,879 | A | 8/1994 | Sauer |
| 5,432,122 | A | 7/1995 | Chae |
| 5,521,107 | A | 5/1996 | Yamazaki et al. |
| 5,583,369 | A | 12/1996 | Yamazaki et al. |
| 5,589,406 | A | 12/1996 | Kato et al. |
| 5,619,044 | A | 4/1997 | Makita et al. |
| 5,650,636 | A | 7/1997 | Takemura et al. |
| 5,712,191 | A | 1/1998 | Nakajima et al. |
| 5,729,308 | A | 3/1998 | Yamazaki et al. |
| 5,789,763 | A | 8/1998 | Kato et al. |
| 5,818,076 | A | 10/1998 | Zhang et al. |
| 5,824,574 | A | 10/1998 | Yamazaki et al. |
| 5,837,569 | A | 11/1998 | Makita et al. |
| 5,904,770 | A | 5/1999 | Ohtani et al. |
| 5,929,464 | A | 7/1999 | Yamazaki et al. |
| 5,932,893 | A | 8/1999 | Miyanaga et al. |
| 5,937,282 | A | 8/1999 | Nakajima et al. |
| 5,943,593 | A | 8/1999 | Noguchi et al. |
| 5,946,561 | A | 8/1999 | Yamazaki et al. |
| 5,953,597 | A | 9/1999 | Kusumoto et al. |
| 5,956,603 | A | 9/1999 | Talwar et al. |
| 5,976,959 | A | 11/1999 | Huang |
| 5,981,974 | A | 11/1999 | Makita |
| 6,013,928 | A | 1/2000 | Yamazaki et al. |
| 6,037,610 | A | 3/2000 | Zhang et al. |
| 6,096,581 | A | 8/2000 | Zhang et al. |
| 6,100,860 | A | 8/2000 | Takayama et al. |
| 6,118,149 | A | 9/2000 | Nakagawa et al. |
| 6,204,099 | B1 | 3/2001 | Kusumoto et al. |
| 6,232,156 | B1 | 5/2001 | Ohtani et al. |
| 6,242,289 | B1 | 6/2001 | Nakajima et al. |
| 6,265,745 | B1 | 7/2001 | Kusumoto et al. |
| 6,399,454 | B1 | 6/2002 | Yamazaki |
| 6,417,031 | B2 | 7/2002 | Ohtani et al. |
| 6,417,896 | B1 | 7/2002 | Yamazaki et al. |
| 6,465,268 | B2 | 10/2002 | Hirakata et al. |
| 6,475,840 | B1 | 11/2002 | Miyanaga et al. |
| 6,479,329 | B2 | 11/2002 | Nakajima et al. |
| 6,479,837 | B1 | 11/2002 | Ogawa et al. |
| 6,498,369 | B1 | 12/2002 | Yamazaki et al. |
| 6,509,212 | B1 | 1/2003 | Zhang et al. |
| 6,515,428 | B1 | 2/2003 | Yeh et al. |
| 6,552,768 | B1 | 4/2003 | Matsuda |
| 6,556,711 | B2 | 4/2003 | Koga et al. |
| 6,582,996 | B1 | 6/2003 | Hara et al. |
| 6,608,325 | B1 | 8/2003 | Zhang et al. |
| 6,646,288 | B2 | 11/2003 | Yamazaki et al. |
| 6,661,180 | B2 | 12/2003 | Koyama |
| 6,709,905 | B2 | 3/2004 | Kusumoto et al. |
| 6,730,550 | B1 | 5/2004 | Yamazaki et al. |
| 6,737,672 | B2 | 5/2004 | Hara et al. |
| 6,743,650 | B2 | 6/2004 | Hirakata et al. |
| 6,962,837 | B2 | 11/2005 | Yamazaki |
| 7,109,073 | B2 | 9/2006 | Yamazaki |
| 7,129,120 | B2 | 10/2006 | Yamazaki |
| 7,229,861 | B2 | 6/2007 | Nakajima et al. |
| 2001/0045563 | A1 | 11/2001 | Kusumoto et al. |
| 2001/0051398 | A1 | 12/2001 | Hirakata et al. |
| 2002/0014623 | A1 | 2/2002 | Kusumoto et al. |
| 2002/0097350 | A1 | 7/2002 | Haven et al. |
| 2003/0016196 | A1 | 1/2003 | Lueder et al. |
| 2003/0017634 | A1 | 1/2003 | Hirakata et al. |
| 2003/0024904 | A1 | 2/2003 | Tanaka |
| 2003/0025166 | A1 | 2/2003 | Yamazaki et al. |
| 2003/0047732 | A1 | 3/2003 | Yamazaki et al. |
| 2003/0052336 | A1 | 3/2003 | Yamazaki et al. |
| 2003/0059990 | A1 | 3/2003 | Yamazaki |
| 2003/0062845 | A1 | 4/2003 | Yamazaki et al. |
| 2003/0075733 | A1 | 4/2003 | Yamazaki |
| 2003/0100169 | A1 | 5/2003 | Tanaka et al. |
| 2004/0106237 | A1 | 6/2004 | Yamazaki |

FOREIGN PATENT DOCUMENTS

| | | |
|---|---|---|
| EP | 1 045 447 A2 | 10/2000 |
| EP | 1 058 311 A2 | 12/2000 |
| JP | 60-143666 | 7/1985 |
| JP | 62-104117 | 5/1987 |
| JP | 02-140915 | 5/1990 |
| JP | 02-181419 | 7/1990 |
| JP | 06-289431 | 10/1994 |
| JP | 07-092501 | 4/1995 |
| JP | 08-195357 | 7/1996 |
| JP | 10-319907 | 12/1998 |
| JP | 10-339889 | 12/1998 |
| JP | 11-271731 | 10/1999 |
| JP | 2000-150377 | 5/2000 |
| JP | 2000-221907 | 8/2000 |
| JP | 2000-356788 | 12/2000 |
| JP | 2001-176796 | 6/2001 |
| TW | 409293 | 10/2000 |
| WO | WO/00/13213 | 3/2000 |

OTHER PUBLICATIONS

SID 00 Digest, pp. 924-927; Jan. 1, 2000, Inukai et al.; "*TFT-OLED Displays and a Novel Digital Driving Method*".

U.S. Appl. No. 10/238,050; filed Sep. 10, 2002 "Light Emitting Device and Method of Manufacturing Semiconductor Device" (Filing Receipt, Specification, Claims and Drawings).

U.S. Appl. No. 10/219,815; filed Aug. 21, 2002 "Method for Fabricating Semiconductor Device" (Filing Receipt, Specification, Claims and Drawings).

Inukai et al.; "*TFT-OLED Displays and a Novel Digital Driving Method*"; SID 00 Digest, pp. 924-927; Jan. 1, 2000.

Hara et al., "Ultra-High Performance Poly-Si TFTs on a Glass by a Stable Scanning CW Laser Lateral Crystallization", pp. 227-230, 2001, AM-LCD, TFT3-1.

Takeuchi et al., "Performance of Poly-Si TFTs Fabricated by a Stable Scanning CW Laser Crystallization", pp. 251-254, 2001, AM-LCD, TFT4-3.

Specifications and Drawings for U.S. Appl. No. 09/633,869.

Inukai et al.; "*TFT-OLED Displays and a Novel Digital Driving Method*"; SID 00 Digest, vol. XXXI, pp. 924-927; Jan. 1, 2000.

Hara et al., "Ultra-High Performance Poly-Si TFTs on a Glass by a Stable Scanning CW Laser Lateral Crystallization", pp. 227-230, 2001, AM-LCD, '01 Digest of Technical Papers, TFT3-1.

Takeuchi et al., "Performance of Poly-Si TFTs Fabricated by a Stable Scanning CW Laser Crystallization", pp. 251-254, 2001, AM-LCD, '01 Digest of Technical Papers, TFT4-3.

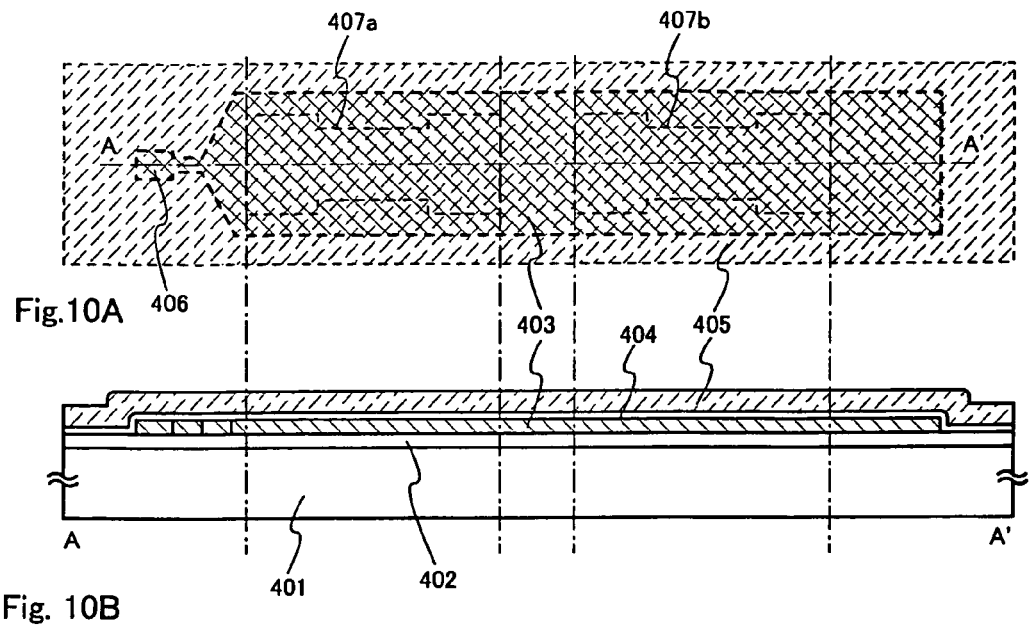
Fig. 10A
Fig. 10B
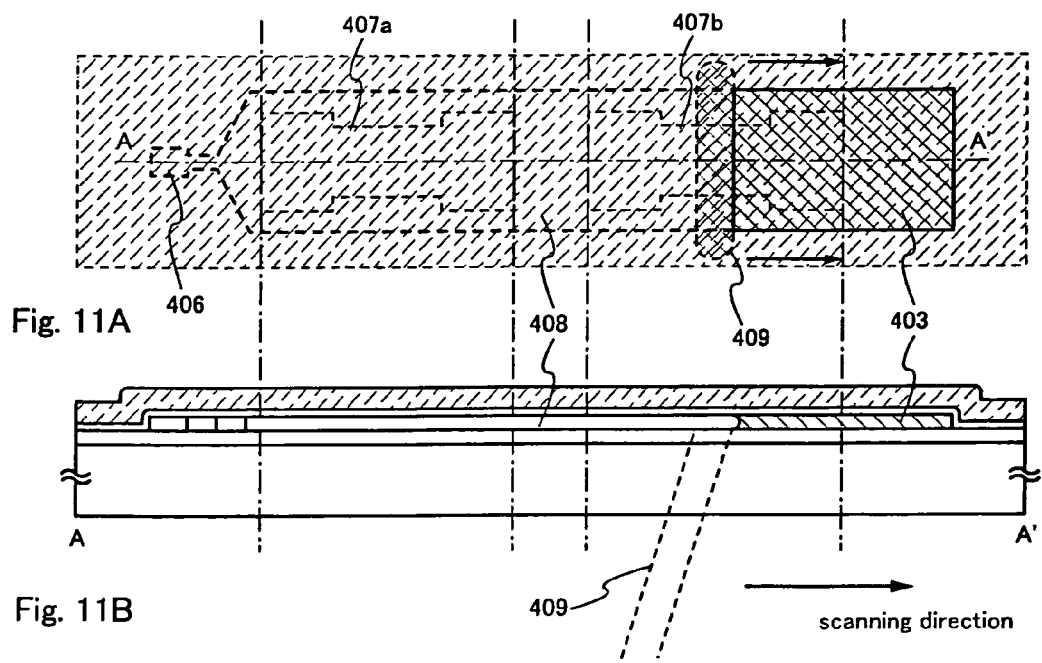
Fig. 11A
Fig. 11B
scanning direction

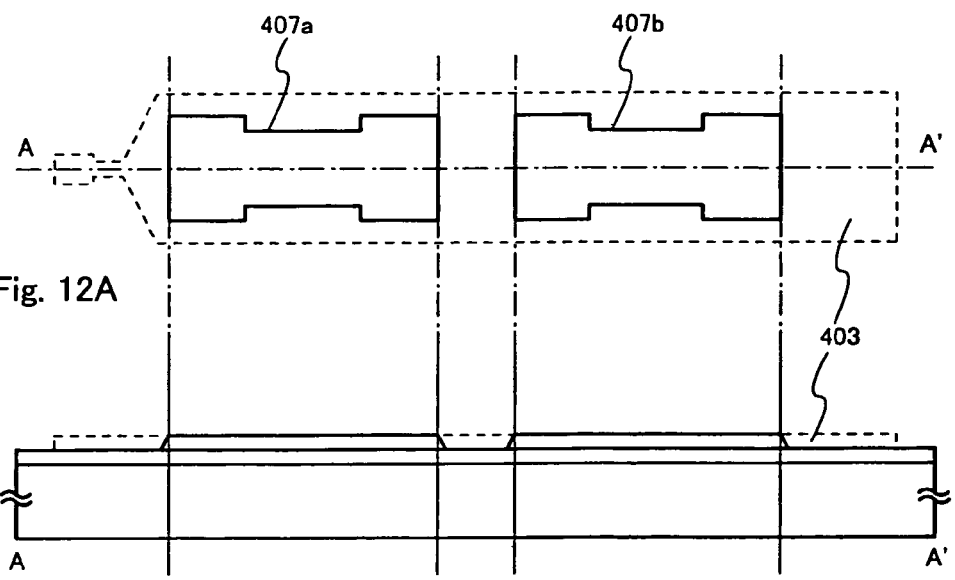
Fig. 12A
Fig. 12B
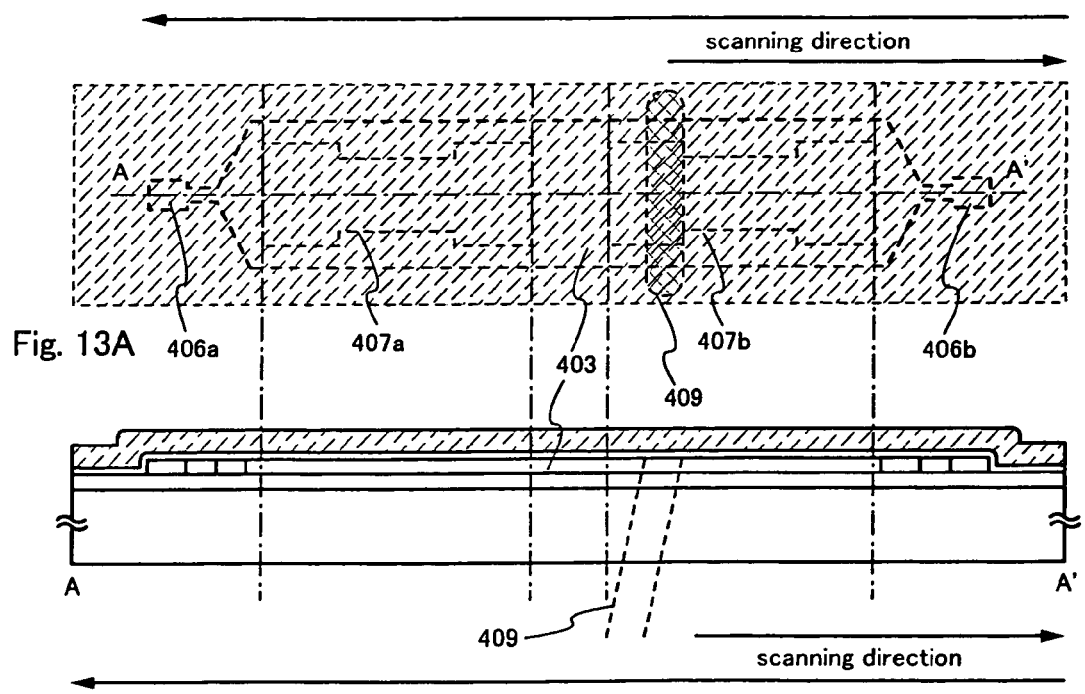
Fig. 13A
Fig. 13B

METHOD FOR MANUFACTURING SEMICONDUCTOR DEVICE

BACKGROUND OF THE INVENTION

1. Field of the Invention

The present invention relates to a method for producing a semiconductor device by employing a laser annealing method. More particularly, the invention relates to a technique for improving crystallization of an amorphous semiconductor film or crystalline characteristics by a laser beam.

2. Description of the Related Art

A technique, which an amorphous semiconductor film formed on a substrate such as a glass is crystallized by a laser annealing method, has been developed. The laser annealing method described in the specification includes a technique re-crystallizing a damaged layer or an amorphous layer which is formed in a semiconductor substrate or a semiconductor film, a technique crystallizing an amorphous semiconductor film formed on a substrate, or a technique improving crystalline characteristics of a semiconductor film (crystalline semiconductor film) having a crystal structure. In a laser oscillation machine applied to laser annealing of a semiconductor, gas lasers, typically an excimer laser or solid state lasers, typically a YAG laser is used usually for the laser annealing.

An example of conventional laser annealing methods is disclosed in Japanese Patent Laid-Open No. 2-181419 which is a method irradiating a laser beam uniformly over an irradiated substance, a method scanning a spot shape of beam is disclosed in Japanese Patent Laid-Open No. 62-104117, and an irradiation method in which a laser treatment machine deforms a beam in line shape by an optical system is disclosed in Japanese Patent Laid-Open No. 8-195357.

In above Japanese Patent Laid-Open No. 62-104117, a technique is that scanning rate of a laser beam is set at not lower than a beam spot diameter ×5000/sec, and poly-crystallization of an amorphous semiconductor film is performed without the amorphous semiconductor film completely melted. A technique which a substantial single crystal region is obtained in such a way of irradiation of an extended laser beam to a semiconductor region formed in an island shape is closed in U.S. Pat. No. 4,330,363.

One of features of the laser annealing method is that only a region absorbing energy of the laser beam can be selectively heated unlike an annealing method utilizing radiant heating or conductive heating. For example, a laser annealing using an excimer laser heats selectively and locally a semiconductor film to perform crystallization of a semiconductor film or activation treatment with little thermal damage to a glass substrate.

Active application of the laser annealing in recent years is focused on a formation of the poly-crystalline silicon film on a glass plate, the technique is applied to a formation of a thin film transistor (TFT) which is utilized for a switching element of a liquid crystal display apparatus. Use of the excimer laser effects thermal influence only to a region where the semiconductor film is formed so that a low cost glass substrate can be used.

TFT made from the crystallized poly-crystalline silicon film by the laser annealing can be driven at relatively high frequency, which enables the TFT not only to be provided in a pixel element as a switching element but also to be formed on a glass substrate as a driving circuit. A design rule of a pattern is in the order of 5 to 20 μm, the order of $10^6$ to $10^7$ of each TFT are formed in the driving circuit and pixel portion on the glass substrate respectively.

Crystallization of an amorphous silicon film by using the laser annealing method is achieved through a process of melting-solidification, and in particular it is considered that the crystallization consists of a crystalline nucleation stage and a stage of crystal growth from the crystalline nucleus. However, the crystallization by using a pulsed laser beam can not control a location of nucleation and nucleation density, which causes a spontaneous crystalline nucleus to be expected in the present circumstance. Consequently, a crystal grain is created at an optional location over the glass substrate, its size as small as the order of 0.2 to 0.5 μm can be only obtained. Grain boundary usually includes many crystal defects so that the crystal defects are considered as a factor of limitation of electric field effect mobility of TFT.

It is said that a non-melting region is formed in the pulsed laser annealing. In the pulsed laser annealing, larger grain size of the crystal can not be realized, because the crystal growth caused by the crystalline nucleus is dominant. In concrete, the crystal in which the grain boundary does not exist in a channel region of TFT and the crystal regarded substantially as a single crystal in a view of an element level can not be formed.

A created defect and dislocation in not only a grain boundary but also any other locations are caused by shrinkage of a film due to denseness in case of crystallization. Especially the defect in case of retraction of volume is pointed out that the defect is generated in an outer portion when a semiconductor film divided in an island shape is crystallized by a laser annealing method.

On the other hand, a method which the crystallization is achieved through a process of melting-solidification by scanning a continuous wave laser beam is considered to be close to zone melting method and to be able to realize a larger grain size by a continuous crystal growth. A problem is that quality of the finally obtained crystal depends on crystalline characteristics of a region which is crystallized at first to become a seed.

A wavelength of laser beams being able to heat a semiconductor film exists in a wide range from an ultraviolet region to an infrared region, and it is considered that the laser beam having the wavelength in the range from an ultraviolet region to a visible light region is applicable from a viewpoint of absorption coefficient of the semiconductor when a semiconductor film formed on a substrate or a semiconductor region separately formed is heated selectively. However, light of a solid state laser which can obtain relatively high power even in a visible light region generates interference on a irradiated surface because of long coherent length, which causes uniform irradiation of the laser beam to be difficult.

Crystallization by the continuous wave laser beam having longer time melting state than the pulsed laser beam increases a ratio being taken impurity in a crystal from the outside, and its segregation causes the defect to be generated, even though the crystalline characteristics are improved. Consequently, a problem is that quality of crystal becomes worse.

In view of the foregoing, it is an object of the invention to provide a technique forming a crystalline semiconductor film whose orientation is uniform by control of crystalline orientation and obtaining a crystalline semiconductor film in which a concentration of an impurity is reduced.

SUMMARY OF THE INVENTION

In order to solve above described problems, a configuration of the invention is that at least a first semiconductor region is formed on a substrate having transparency in a visible light region, a barrier film is formed over the first semiconductor region, a heat retaining film covering a top surface and side surfaces of the first semiconductor region is formed through the barrier film, the first semiconductor region is crystallized by scanning of a continuous wave laser beam from one edge of the first semiconductor region to the other through the substrate, the heat retaining film and the barrier film are removed, then a second semiconductor region is formed as an active layer of TFT by etching the first semiconductor region. A pattern of the second semiconductor region formed by etching is formed in a manner that a scanning direction of the laser beam and a channel length direction of the TFT are arranged in almost the same direction in order to smooth drift of carriers.

The heat retaining film is provided to prevent the first semiconductor region from becoming a micro crystal when the first semiconductor region heated up to a melting state by the irradiation of the laser beam is cooled rapidly after the irradiation of the laser beam. It is known that many crystalline nucleus are generated to become micro crystals when a semiconductor region is cooled rapidly from a melting state, however it can be prevented by providing the heat retaining film. That is to say, by providing the heat retaining film, cooling rate is slowed in a process of solidification after the irradiation of the laser beam, which permits crystal growth time to be extended.

The barrier film is provided as an etching stopper in case of removal of the heat retaining film. A silicon type semiconductor and a material having selectivity for etching such as silicon oxide or silicon nitride are used for the barrier film. A material having good thermal conductivity such as aluminum nitride, aluminum oxide or aluminum nitride oxide may also be used.

An impurity element such as a metal segregating in the first semiconductor region during crystallization process is removed by gettering treatment. In the gettering treatment, after removal of the heat retaining film and the barrier film, an amorphous semiconductor film is formed on the first semiconductor region, the metallic element is segregated in the amorphous semiconductor film by heating treatment, then the amorphous semiconductor film and the barrier film are removed. The gettering treatment is done after the first semiconductor region is crystallized, which causes the impurities such as metal segregated in the semiconductor region to be removed. This allows a high purity crystal to be obtained.

A substance which is formed into a fixed pattern by etching the amorphous semiconductor film formed on the substrate is applicable to the first semiconductor region. That is to say, it is possible to be formed by the amorphous semiconductor. It is also possible to be formed by a substance crystallized beforehand.

In that case, as a method for producing a semiconductor device, an amorphous semiconductor film is formed on a substrate, after adding a catalytic element the amorphous semiconductor film is crystallized by heating treatment to form a crystalline semiconductor film, a first semiconductor region is formed by etching the crystalline semiconductor film, a barrier film covering the first semiconductor region is formed, a heat retaining film covering a top surface and side surfaces of the first semiconductor region is formed through the barrier film, crystalline characteristics of the first semiconductor region are improved by scanning of a continuous wave laser beam from one edge of the first semiconductor region to the other through the substrate, the heat retaining film and the barrier film are removed, and a second semiconductor region is formed by etching the first semiconductor region in a manner that a scanning direction of the laser beam and a channel length direction of a thin film transistor are arranged in almost the same direction.

As another method for producing a semiconductor device, an amorphous semiconductor film is formed on a substrate, after adding selectively a catalytic element the amorphous semiconductor film is crystallized from a region where the catalytic element is added selectively to a direction parallel to the substrate by heating treatment to form a crystalline semiconductor film, a first semiconductor region is formed by etching the crystalline semiconductor film, a barrier film covering the first semiconductor region is formed, a heat retaining film covering a top surface and side surfaces of the first semiconductor region is formed through the barrier film, crystalline characteristics of the first semiconductor region are improved by scanning of a continuous wave laser beam from one edge of the first semiconductor region to the other through the substrate, the heat retaining film and the barrier film are removed, and a second semiconductor region is formed by etching the first semiconductor region in a manner that a scanning direction of the laser beam and a channel length direction of a thin film transistor are arranged in the same direction.

A technique for forming a seed region, which is contact with the first semiconductor region and becomes a seed, before the crystallization of the first semiconductor region is applied to a method for deciding crystal orientation of the second semiconductor layer formed finally as an active layer of TFT.

In that case, as a method for producing a semiconductor device of the invention, a first amorphous semiconductor film is formed on a substrate, after adding a catalytic element the first amorphous semiconductor film is crystallized by heating treatment to form a first crystalline semiconductor film, a seed crystal region is formed by etching the first crystalline semiconductor film, a second amorphous semiconductor film overlapping with the seed crystal region is formed on the substrate, the second amorphous semiconductor film is etched to form a first semiconductor region overlapping with the seed crystal region at least partly, a barrier film covering the first semiconductor region is formed, a heat retaining film covering a top surface and side surfaces of the first semiconductor region is formed through the barrier film, the first semiconductor region is crystallized by scanning of a continuous wave laser beam from one edge overlapping with the seed region to the other in the first semiconductor region through the substrate, the heat retaining film and the barrier film are removed, and a second semiconductor region is formed by etching the first semiconductor region and the seed region in a manner that a scanning direction of the laser beam and a channel length direction of a thin film transistor are arranged in the same direction.

As another method for producing a semiconductor device, a first amorphous semiconductor film containing silicon and germanium is formed on a substrate, after adding a catalytic element the first amorphous semiconductor film is crystallized by heating treatment to form a first crystalline semiconductor film, a seed crystal region is formed by etching the first crystalline semiconductor film, a second amorphous semiconductor film overlapping with the seed crystal region is formed on the substrate, the second amorphous semiconductor film is etched to form a first semiconductor region overlapping with the seed crystal region at least partly, the heat retaining film and the barrier film are removed, and a second semiconductor region is formed by etching the first semiconductor region and the seed crystal region in a manner that a scanning direction of the laser beam and a channel length direction of a thin film transistor are arranged in the same direction.

When the catalytic element is added to the amorphous semiconductor film containing silicon and germanium to be crystallized, the crystalline semiconductor film having high orientation rate of {101} face can be obtained. From experimental results, development of the effect requires concentration of germanium in the range of not lower than 0.1 at % and not more than 10 at %, preferably not lower than 1 at % and not more than 5 at % based on silicon. In case that the concentration of germanium is greater than the upper limit value, because creation of natural nucleus which generates as alloys of silicon and germanium (nucleus generated regardless of compounds with the metal elements to be added) becomes prominent, an orientation ratio of the obtained polycrystalline semiconductor film can not be increased. In case that the concentration of germanium is lower than the lower limit value, since sufficient distortion can not be created, the orientation ratio can not be increased. The crystalline semiconductor film having high orientation rate of {101} face is made as seed region, which results in high crystal orientation of a third semiconductor region formed finally and obtaining the crystalline semiconductor of single orientation.

A catalytic element which is one element or a plurality of elements selected from Fe, Co, Ni, Ru, Rh, Pd, Os, Ir, Pt, Cu, and Au is applicable to the amorphous semiconductor film containing silicon and germanium. The amorphous semiconductor film thickness of 10 nm to 20 nm is formed. The metallic element is added to the amorphous silicon film to perform heat treatment, a compound (silicide compound) of silicon and the metallic element is formed, and the crystallization proceeds by diffusing the compound. Germanium added to the amorphous silicon film does not react with the compound, but exists around the compound to generate local distortion. The distortion functions to a course of enlarging critical radius of nucleation, which effects on reduction of nucleation density and limitation of crystal orientation.

In the crystalline semiconductor film, gettering treatment is applicable as a method for removing a impurity which is taken into from outside of the film by a catalytic element used for the crystallization or experience of a melting state. The amorphous semiconductor or the crystalline semiconductor added an 18 group element (rare gas element) of the periodic law such as phosphorus or argon is suitable to a gettering site (region segregating impurity) forming distortion field. The gettering treatment enables the catalytic element and a metallic element contaminated through a process of the crystallization to be removed. This permits defect density caused by impurity to be reduced.

By the method described above, the second semiconductor region formed by etching the first semiconductor region can be a crystal which is regarded as a substantial single crystal. That is to say, the scanning direction of the continuous wave laser beam becomes the same (parallel direction) as the channel length direction of the TFT, which permits the crystalline semiconductor film constituted by single crystal grains to be formed over the whole channel forming region.

In the constitution of the invention, the substrate is made from a substrate for semiconductor such as no alkali glass including barium borosilicate glass and aluminosilicate glass or quartz.

A gas laser oscillation apparatus and a solid state laser oscillation apparatus, preferably laser oscillation apparatus being capable of continuous oscillation are applied to the laser oscillation apparatus applied to the invention. A laser oscillation apparatus provided with a crystal such as YAG, $YVO_4$, YLF and $YAlO_3$ doped with Cr, Nd, Er, Ho, Ce, Co, Ti or Tm is applicable to the continuous wave solid state laser oscillation apparatus. A wavelength of a fundamental wave depends on a dopant material, and the laser oscillation apparatus is oscillated at a wavelength of 1 μm to 2 μm. By using the laser beam having a wavelength from a visible light region to an ultraviolet region, which is preferably a second harmonics to a fourth harmonics of the fundamental wave, the laser beam is absorbed selectively into the semiconductor film to crystallize the amorphous semiconductor film. Typically, in case of the crystallization of the amorphous semiconductor film, the second harmonics (532 nm) of $Nd:YVO_4$ laser (fundamental wave is 1064 nm) is used. The gas laser oscillation apparatus such as an argon gas laser and a krypton gas laser also can be applicable.

Anyhow, from a point of view of absorption coefficient of the semiconductor film, the wavelength of the continuous wave laser beam is desirably in the range of 400 nm to 700 nm. In case of light of a longer wavelength than the range, because the absorption coefficient of the semiconductor is small, even the substrate is damaged thermally when power density is increased for melting. And In case of light of a shorter wavelength than the range, because the light is almost absorbed on the surface of the semiconductor, the semiconductor can not be heated from inside, so that random crystal growth becomes dominant under the influence of surface condition.

The laser beam radiated from the solid state laser oscillation apparatus has strong coherence, interference is created on an irradiated surface, so that a configuration, in which a plurality of laser beams radiated from different laser oscillation apparatus are superposed on an irradiated portion, is provided as means for canceling the interference. This configuration permits not only the interference to be eliminated but also substantial energy density on the irradiated portion to be increased. Configuration in which a plurality of laser beams radiated from different laser oscillation apparatus are superposed to the same light axis on the light path of the optical system may be another means.

A configuration of the laser treatment apparatus provided with above described means for canceling the interference includes n (n is natural number) of optical systems, n-th optical system has n-th laser oscillation apparatus, deflecting unit for operating the laser beam in n-th Y axis direction, deflecting unit for scanning the laser beam in n-th X axis direction and n-th fθ lens, n of laser beams condensed and deflected by n of optical systems are irradiated on almost the same location of a semiconductor film as the treated substance. A galvano mirror is applicable to the deflecting unit.

In the configuration of the laser treatment apparatus described above, the laser beam having sufficient energy density for melting the semiconductor can be irradiated without generating the interference on the irradiated portion, by scanning the laser beam with a location of the laser beam controlled by deflecting unit, only a specific region where the semiconductor region is formed can be treated even in a large size substrate. As a result, a throughput in a crystallization process can be improved.

The amorphous semiconductor film referred to in the invention includes not only a material having complete amorphous structure in the narrow sense but also a state containing fine crystalline particles, so-called fine crystal semiconductor film and a semiconductor film containing crystalline structure locally. Typically, an amorphous silicon film is applicable, an amorphous silicon germanium film and an amorphous silicon carbide film are also applicable.

BRIEF DESCRIPTION OF THE DRAWINGS

The above and other objects of the invention will be seen by reference to the description taken in connection with the accompanying drawings, in which:

FIGS. 10A and 10B are views illustrating a crystallization process according to an embodiment of the invention.

FIGS. 11A and 11B are views illustrating a crystallization process according to an embodiment of the invention.

FIGS. 12A and 12B are views illustrating a crystallization process according to an embodiment of the invention.

FIGS. 13A and 13B are views illustrating a crystallization process according to an embodiment of the invention.

DESCRIPTION OF THE PREFERRED EMBODIMENTS

Figure 1A:
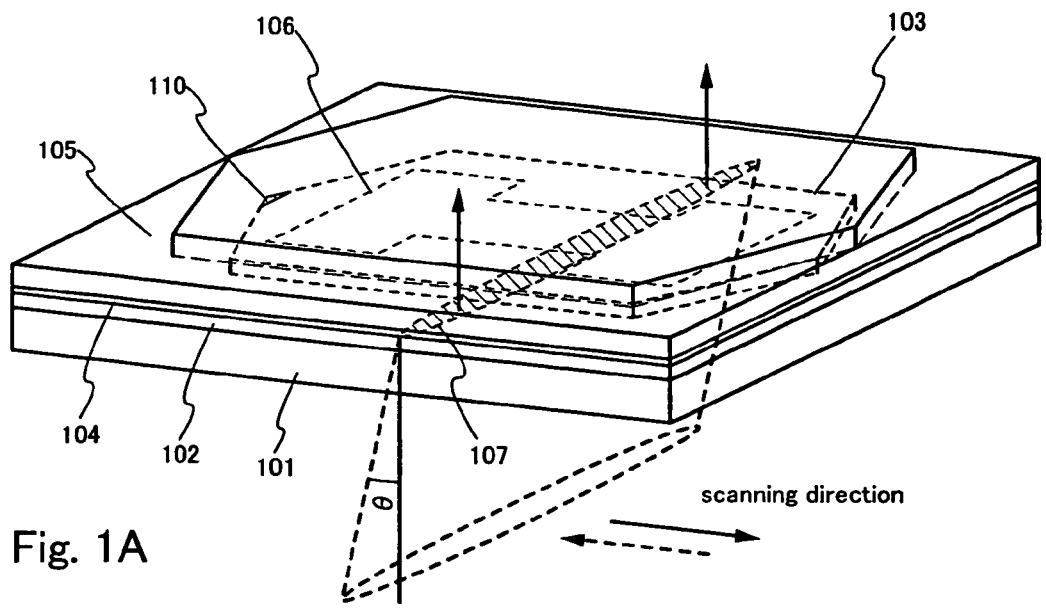
FIGS. 1A-1C illustrate a conception of a method for producing a semiconductor device according to the invention.

Preferred embodiments of the invention will be described below referring to the accompanying drawings. A perspective view shown in FIG. 1A illustrates a state which a blocking layer 102, a first semiconductor region 103, a barrier film 104 and a heat retaining film 105 are formed on a substrate 101. A no alkali glass plate can be used for the substrate 101. The first semiconductor region 103 is made from a semiconductor material such as silicon, a compound or alloys of silicon and germanium, and a compound or alloys of silicon and carbon. Silicon is the most suitable in these materials. The thickness of the first semiconductor region 103 is in the range of 30 to 200 nm.

The substrate 101 is made from a substrate for semiconductor such as no alkali glass including barium borosilicate glass and aluminosilicate glass or quartz. Synthetic resin such as polyethylene naphthalate and polyether sulfone can be also applicable.

A second semiconductor region 106 forming an active layer of TFT shown by dotted lines is formed from the first semiconductor region 103. The second semiconductor region 106 is formed inside an edge portion of the first semiconductor region 103. A term of the active layer includes an impurity region where a valence electron is controlled such as a channel forming region of the TFT and a source region or a drain region.

A laser beam 107 is scanned in one direction for the first semiconductor region 103 to be crystallized. Back-and-forth strokes parallel to the direction of first scan may also be done. A wavelength band of the laser beam is used a wavelength which the laser beam can be transmitted through the substrate and the main semiconductor material forming the first semiconductor region absorbs the laser beam. In case that the semiconductor material is an amorphous silicon, though it depends on hydrogen content, the laser beam having a wavelength in the range of 400 to 700 nm of a visible light region is irradiated in consideration of the film thickness of the amorphous silicon. This permits the first semiconductor region 103 and the heat retaining film 105 to be selectively heated through the substrate 101. Absorption coefficient of the amorphous silicon is approximately $10^3$ to $10^5$/cm for this wavelength band. Accordingly, the most suitable laser beam is a continuous wave laser beam radiated from a laser oscillation apparatus provided with a crystal such as YAG, $YVO_4$, YLF and $YAIO_3$ doped with Cr, Nd, Er, Ho, Ce, Co, Ti or Tm. Its second harmonic is used in order to obtain the laser beam of the wavelength in the range of 400 to 700 nm. For example, the laser beam of the wavelength of 532 nm as the second harmonic is obtained in case of using $Nd:YVO_4$ laser.

In concrete, penetration depth of light of the first semiconductor region 103 made from the amorphous silicon film for the wavelength of 532 nm is approximately 100 to 1000 nm, it can be sufficiently reached inside the first semiconductor region having a thickness of 30 to 200 nm. That is to say, it is possible to heat from the inside of the semiconductor film and also to heat uniformly almost all of the semiconductor film in an irradiated region of the laser beam. The wavelength of the laser beam is not limited to the value of 532 nm, and it is possible to decide the wavelength of the laser beam in consideration of the absorption coefficient of the semiconductor material forming the first semiconductor region 103.

As an irradiation method shown in FIG. 1A, the laser beam is irradiated from the substrate 101 side with the laser beam inclined at an angle θ to a normal of the glass substrate surface. A shape of the laser beam on an irradiated surface is not particularly limited to be elliptical and rectangle, but preferably longer than one side length of the first semiconductor region 103 divided into an island shape.

Outgassing of contained hydrogen and shrinkage due to denseness by rearrangement of atom are generated by crystallization of the amorphous semiconductor film. This causes lattice matching in an interface of the amorphous region and the crystal region not to be maintained, which results in creation of distortion. As shown in FIG. 1A, forming of a second semiconductor region 106 forming an active layer of TFT inside the crystallization region of the first semiconductor region 103 is also to remove the distortion region.

The heat retaining film is provided to prevent the first semiconductor region from becoming a micro crystal when the first semiconductor region heated up to a melting state by the irradiation of the laser beam is cooled rapidly after the irradiation of the laser beam. It is known that many crystalline nucleus are generated to become micro crystals when a semiconductor region is cooled rapidly from a melting state, however it can be prevented by providing the heat retaining film. That is to say, by providing the heat retaining film, cooling rate is slowed in a process of solidification after the irradiation of the laser beam, which permits crystal growth time to be extended.

Figure 2A:
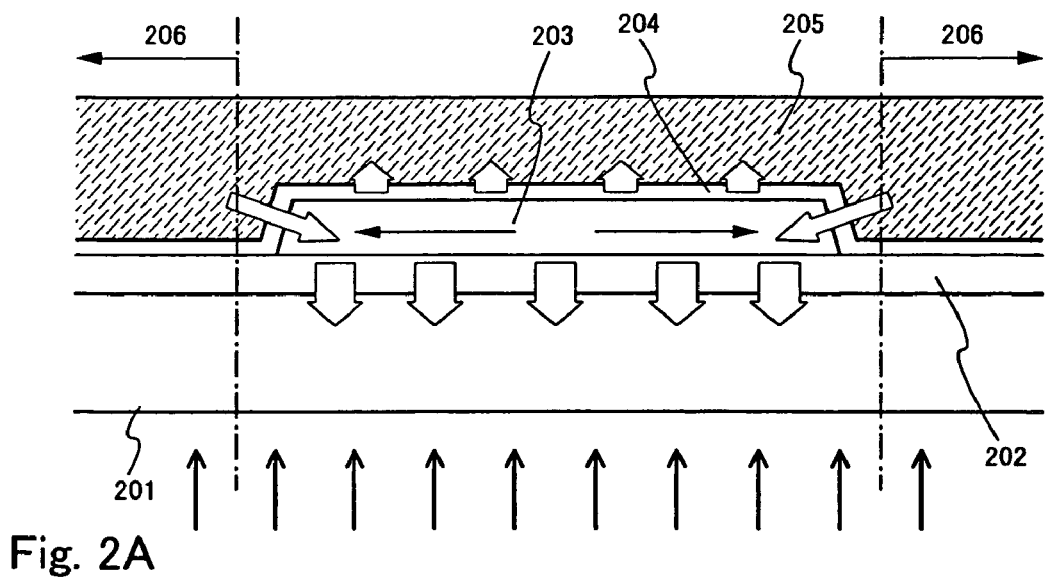
FIGS. 2A and 2B are a view illustrating details of a crystallization process according to the invention.
Figure 2B:
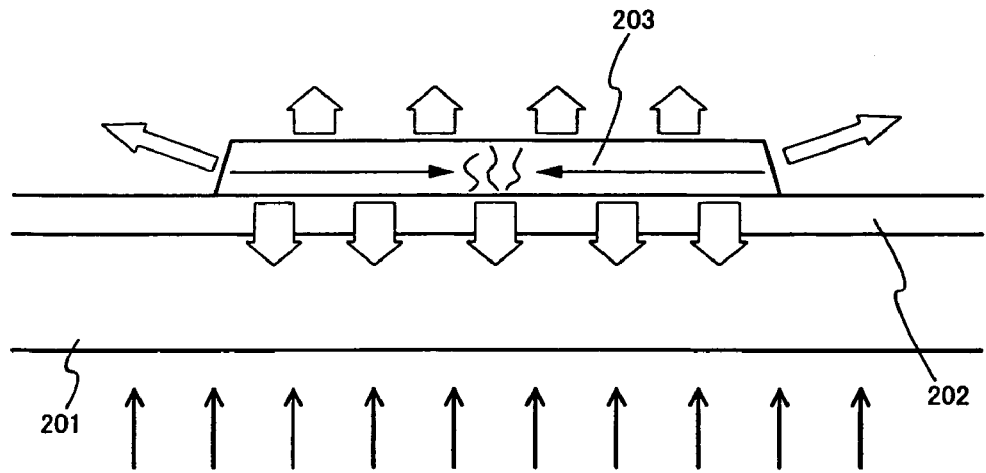

It is found that crystallization proceeds in a process of cooling and solidification of the semiconductor after a melting state by heating of the laser beam. FIGS. 2A and 2B show schematically a propagation direction of heat during a cooling process depending on presence or absence of the heat retaining film. After the semiconductor film formed on the substrate is heated by the laser beam, there are two contents during the cooling process, which are divided into a content propagating to the substrate side and a content propagating into gaseous phase, proportion of the former is larger compared with thermal conductivity.

FIG. 2A shows a state which a blocking layer 202, a first semiconductor region 203, a barrier film 204 and a heat retaining film 205 are formed on a substrate 201. Outline arrows shown in FIG. 2A indicate the direction of heat propagation. There are two heat propagation paths of which one propagates to the substrate side and the heat retaining film side of a region where the first semiconductor region 203 is formed and the other propagates from heat retaining region 206 of the heat retaining film 205 to the first semiconductor region 203. This causes the first semiconductor region 203 to be cooled from a central portion. The crystallization in this case proceeds from the central portion of the first semiconductor region to the outside. FIG. 2B is in case of absence of the heat retaining film, edge portions of the first semiconductor region 203 are cooled fastest because a heat loss ratio is large due to heat propagation. In this case, the crystallization proceeds from the edge portions of the first semiconductor region to the inside, which results in a formation of grain boundaries by facing grown crystals each other in the central portion.

A seed region 110 is provided in a part of a characteristic shape of the first semiconductor region 103 shown in FIG. 1A. By irradiating the laser beam from the part, the semiconductor region having single crystal orientation can be formed. The crystal growth occurs from a crystal formed at first in the seed region 110 or a crystal formed beforehand. A crystal in the seed region is known as a seed crystal, and it may be a crystal formed accidentally and also a crystal whose crystal orientation is fixed intentionally by addition of a catalytic element or a specific element.

Crystallization of an amorphous semiconductor film by employing the catalytic element is suitable in the point of obtaining the crystalline semiconductor film having relatively high orientation ratio. An applicable catalytic element is one element or a plurality of elements selected from Fe, Co, Ni, Ru, Rh, Pd, Os, Ir, Pt, Cu, and Au. The amorphous semiconductor film thickness of 30 to 200 nm is formed.

Germanium is suitable as the specific element, the crystalline semiconductor film having high orientation ratio of {101} face can be obtained by addition of germanium. From experimental results, development of the effect requires concentration of germanium in the range of not lower than 0.1 at % and not more than 10 at %, preferably not lower than 1 at % and not more than 5 at % based on silicon. The metallic element is added to the amorphous silicon film to perform heat treatment, a compound (silicide compound) of silicon and the metallic element is formed, and the crystallization proceeds by diffusing the compound. Germanium added to the amorphous silicon film does not react with the compound, but exists around the compound to generate local distortion. The distortion functions to a course of enlarging critical radius of nucleation, which effects on reduction of nucleation density and limitation of crystal orientation.

Figure 3:
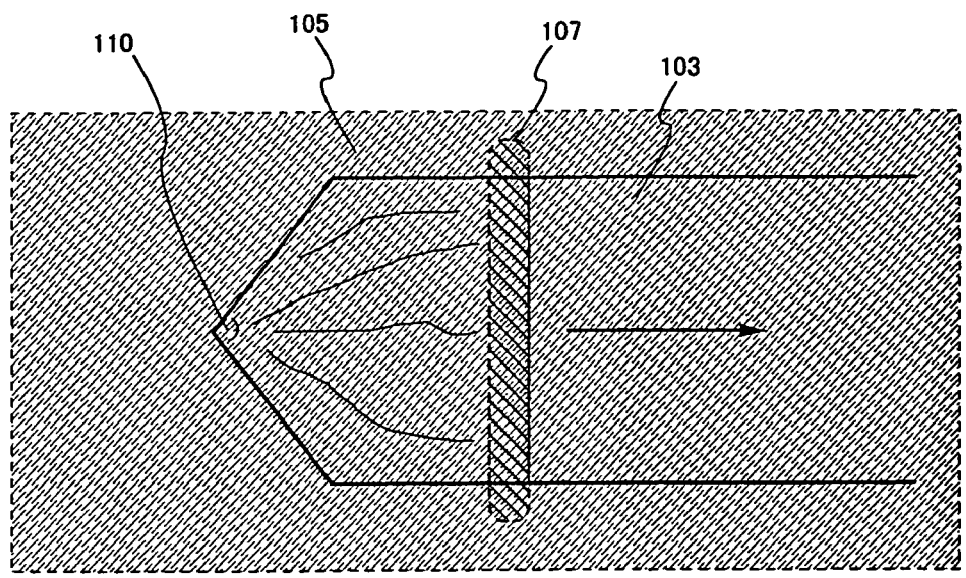
FIG. 3 is a view illustrating details of a crystallization process according to the invention.

Various modes of the seed region 110 are explained below referring to FIG. 3 to FIG. 5. FIG. 3 shows a process which a crystal grows from the seed region 110. The irradiated laser beam 107 is scanned from the seed region 110 provided in one edge of the first semiconductor region 103 to the other with the semiconductor melted, which permits a crystal to be grown according to the scanning direction of the laser beam 107. The heat retaining film 105 is formed above the first semiconductor region 103 or on the surface which is not an incident plane of the laser beam. The laser beam is continuous wave, which maintains a continuous melting region. This enables continuous crystal growth.

As shown in figures, the heat retaining film 105 is formed with the first semiconductor region 103 covered, the laser beam 107 irradiates the heat retaining film 105 located in the first semiconductor region 103 and its both ends. As described by using FIG. 2A, this prevents the crystallization from the edge portions of the first semiconductor region 103 from beginning, and crystal growth depended on the crystalline characteristics of the seed region 110 can be certainly performed. The grown crystal has single crystal orientation. A crystal developed in the seed region 110 may be accidental, a probability obtaining a crystal having orientation of {101} face becomes high by addition of the catalytic element such as Ni. Addition of germanium further raises the probability.

Figure 4:
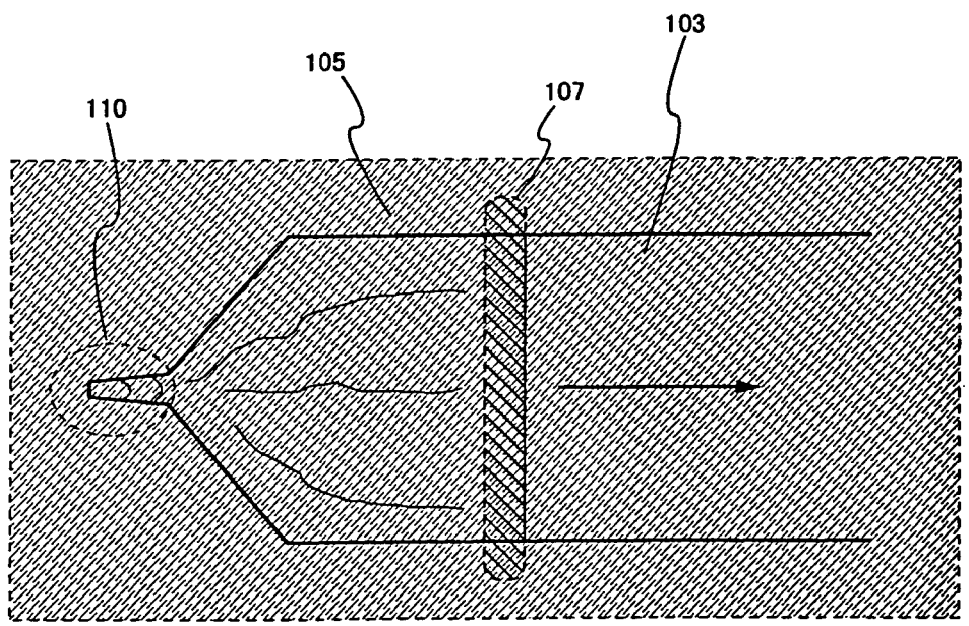
FIG. 4 is a view illustrating details of a crystallization process according to the invention.

A shape raising selectivity of a crystal in the seed region may be a shape projected from the first semiconductor region 103 into the seed region 110 as shown in FIG. 4. A width of the projected portion is 1 to 5 μm, which prevents a plurality of crystal grains from being created spontaneously.

Figure 5:
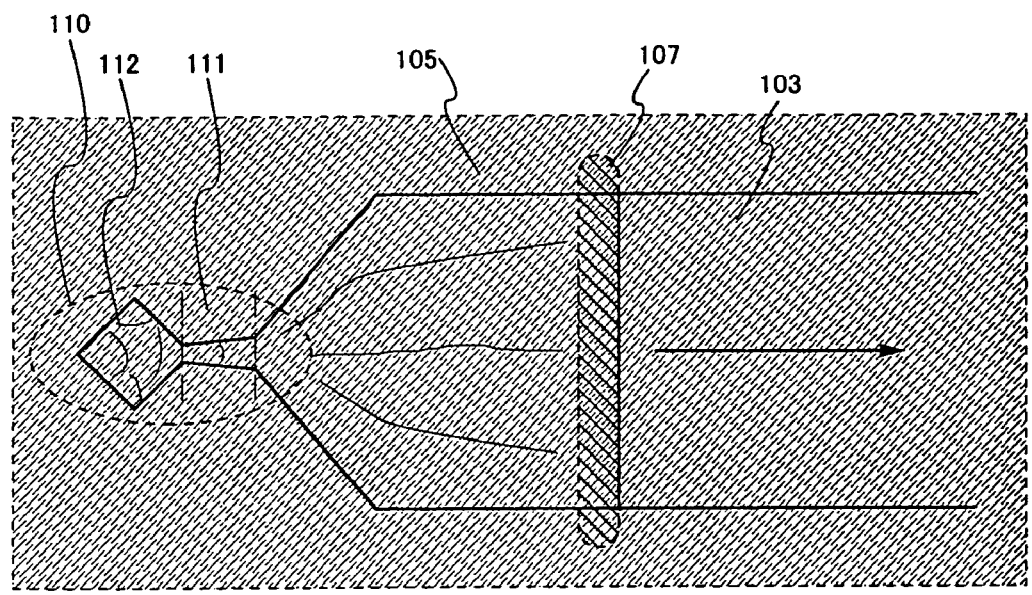
FIG. 5 is a view illustrating details of a crystallization process according to the invention.

Another mode shown in FIG. 5 is suitable shape in case that the seed region 110 is formed by other semiconductor 112 before the first semiconductor region 103 is formed, in a selected region 111, crystal orientation is selected to one direction from the seed region 110, and the selected region 111 is provided to be connected to the first semiconductor region 103. The semiconductor 112 is formed by a different layer from the first semiconductor region 103, and a crystalline semiconductor film crystallized by addition of the catalytic element or a crystalline semiconductor film crystallized from an amorphous silicon semiconductor film comprising silicon having germanium added thereto by addition of the catalytic element is applicable to the semiconductor 112. Because the crystalline semiconductor films have high crystal orientation, crystalline semiconductor films having the same crystal orientation can be obtained with good reproducibility by the semiconductor 107.

The modes of the seed region are not limited to the modes shown here, another mode having the same effect may also be suitable. In case that the seed crystal having a crystal orientation different from {101} face is used, crystal growth according to the crystal orientation can be performed.

After the whole first semiconductor region 103 is crystallized by the irradiation of the continuous wave laser beam shown in the mode of FIG. 1A, addition of gettering treatment is preferable. Though the semiconductor becomes a melting state by the irradiation of the continuous wave laser beam, its time depends on a scanning rate of the beam. The scanning rate is approximately 10 to 100 cm/sec, but contamination of impurity from the outside can not be perfectly prevented. Contents of atmosphere such as oxygen, nitrogen and carbon are not preferable as the impurity, elements of construction member of apparatus such as Fe, Ni and Cr or metallic impurities floating in vapor phase are also not preferable. A first contamination path of the impurities is impurities adhesive to interface of the blocking layer 102 or the barrier film 104 and the first semiconductor region.

In the gettering treatment, after the semiconductor film forming distortion field adjacent to the first semiconductor region is formed, the impurity is segregated by heat treatment. An amorphous semiconductor film added phosphorus and an amorphous semiconductor film added an 18 group element of the periodic law such as argon are suitable as the semiconductor film forming distortion field. A heating temperature is in the range of 500 to 800° C., and a furnace annealing oven and a rapid thermal annealing (RTA) furnace are used. The reaction may be accelerated by the irradiation of the laser beam at the same time.

Figure 1B:
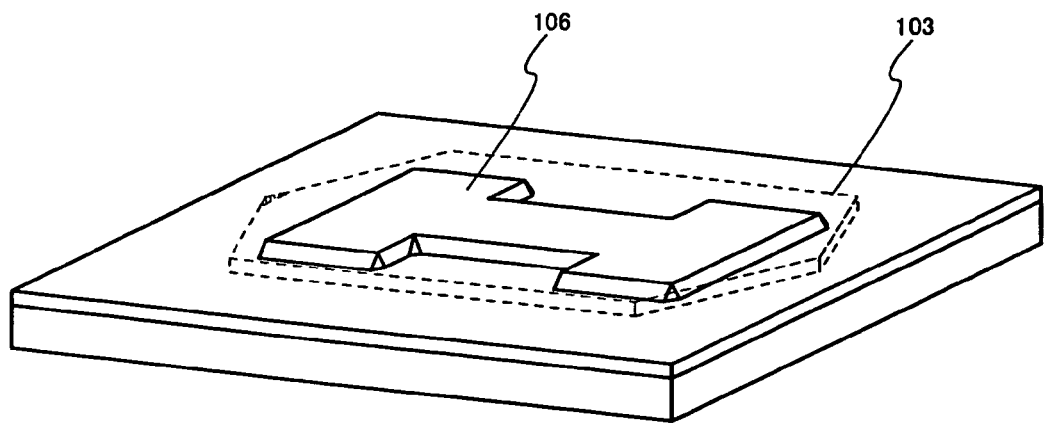
Figure 1C:
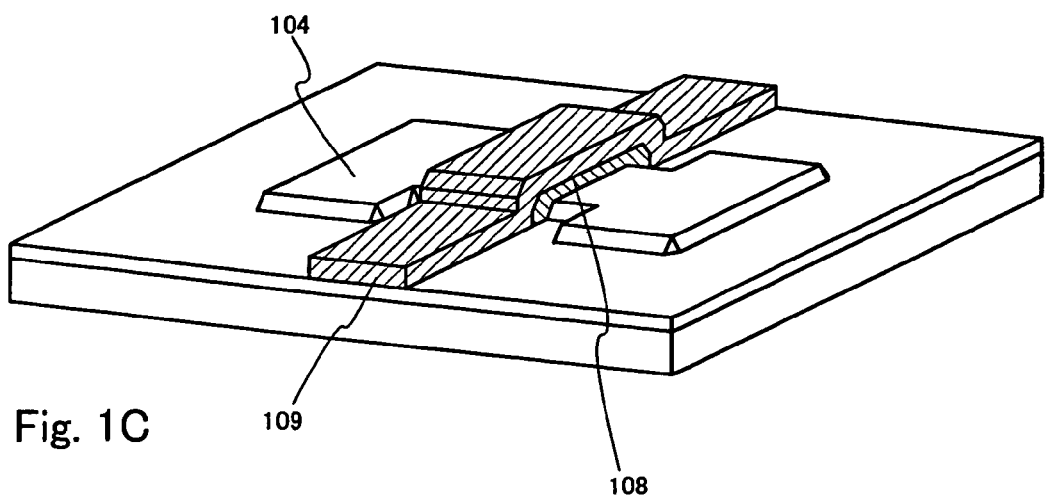

The second semiconductor region 106 is formed as an active layer by etching as shown in FIG. 1B. Then a gate insulating film 108 and a gate electrode 109 are formed as shown in FIG. 1C, a source region and a drain region are formed by addition of one conductive type of impurity to the semiconductor region, and TFT can be obtained by providing required wirings. From a comparison of FIG. 1C and FIG. 1A, it is clear that the scanning direction of the laser beam and a channel length direction in the completed TFT are in the same direction.

In such irradiation methods of the laser beam, the continuous wave laser beam enables crystal growth of a large grain size in the scanning direction. It is necessary to set properly parameters such as a scanning rate of the laser beam or energy density, for example, the laser beam that provides output of 5 W (532 nm) is focused in the size of 20 μm×400 μm and the scanning rate is set 10 to 100 cm/sec. However the crystal growth rate experienced melting-solidification by pulsed laser is about 1 m/sec, scanning the laser beam at lower rate than the pulsed laser to anneal the crystal, which enables continuous crystal growth at a solid-liquid interface. This permits enlargement of a grain size to be achieved. The scanning direction of the laser beam is not limited to the one direction, the back-and-forth strokes of the scanning may be also preferable. Providing the heat retaining film, the crystallization can be proceeded from the central portion of the first semiconductor region toward the outside, which permits the enlargement of the grain size to be achieved.

Figure 6:
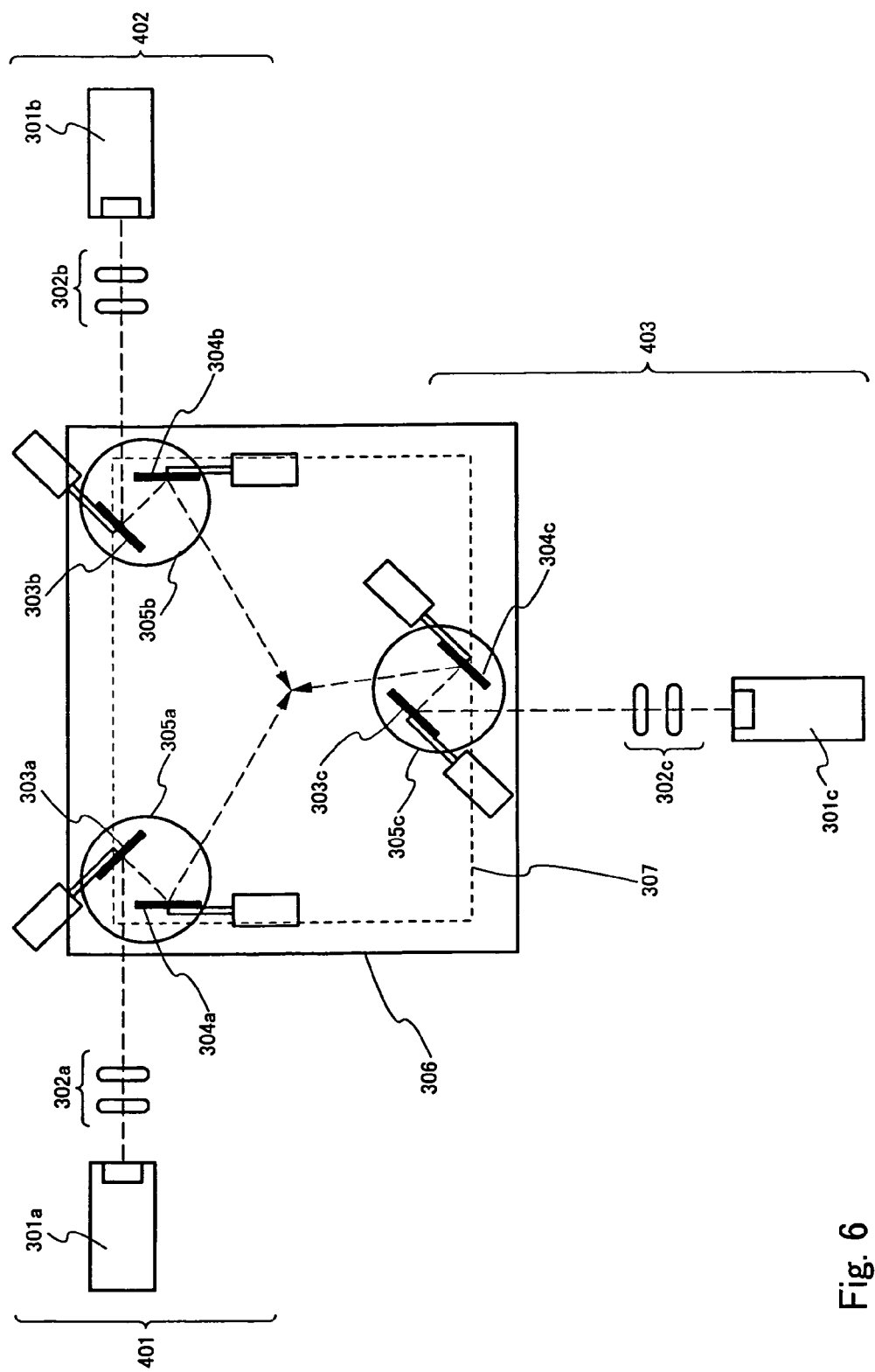
FIG. 6 is a top view showing a configuration of a mode of a laser irradiation apparatus which is applied to the invention.
Figure 7:
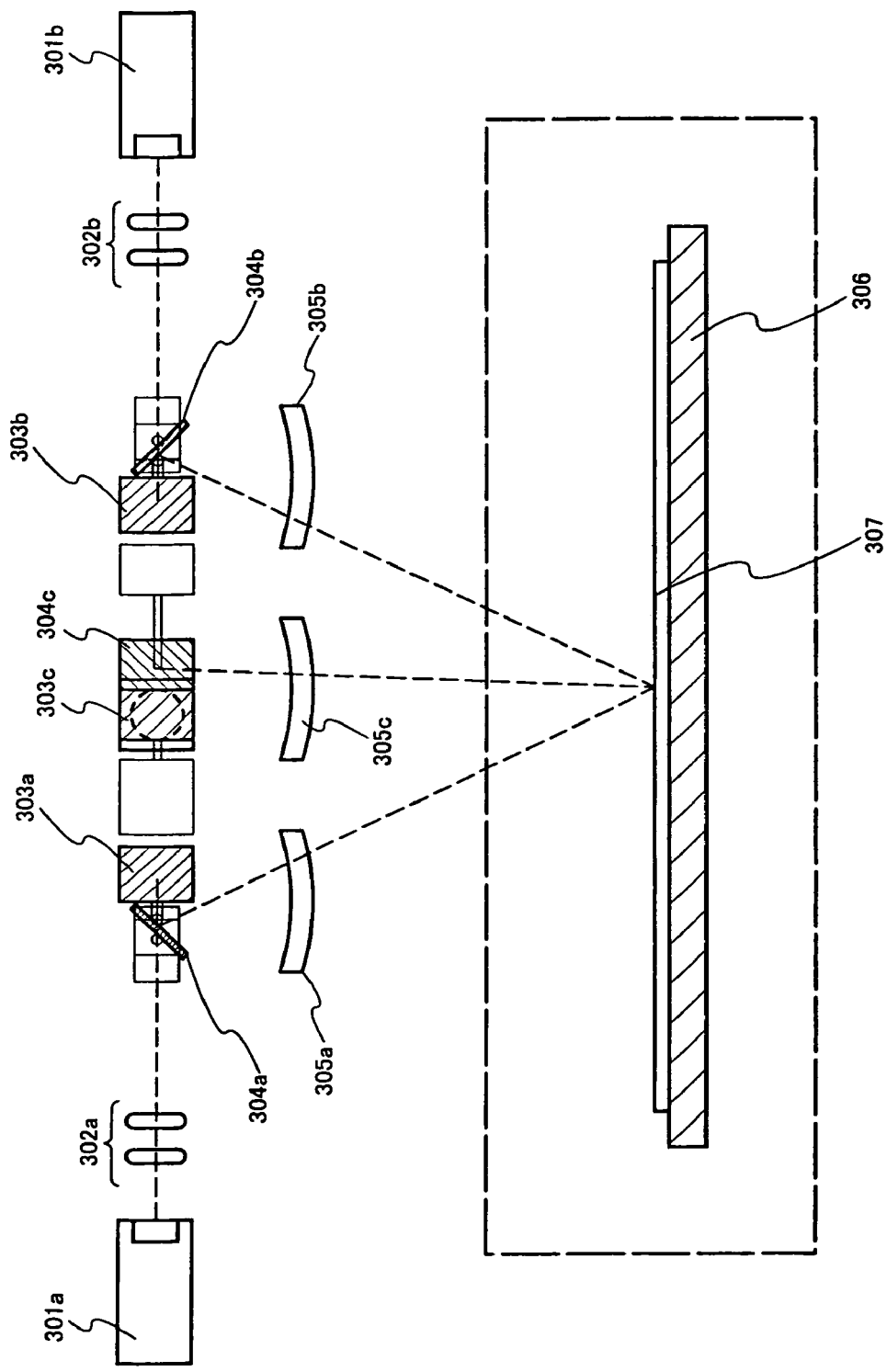
FIG. 7 is a side view showing a configuration of a mode of a laser irradiation apparatus which is applied to the invention.

A mode of a laser treatment apparatus enabling the crystallization is shown in a configuration of FIG. 6 and FIG. 7. The mode of preferable laser treatment apparatus enables crystallization by the irradiation of the laser beam at a location designated optionally on a substrate and improves throughput by the irradiation of the laser beam from a plurality of directions. Especially, in the configuration, a plurality of laser beams are overlapped on an irradiated surface, which results in the necessary energy density for the laser treatment and elimination of light interference.

FIG. 6 is a top view showing a configuration of the laser treatment apparatus, and FIG. 7 is a cross-sectional view corresponding to FIG. 6. In explanation of FIG. 6 and FIG. 7, common reference numerals are used for the convenience of explanation.

A first optical system 401 includes laser oscillation apparatus 301a, a group of lens 302a, a first galvano mirror 303a, a second galvano mirror 304a and fθ lens 305a. The first galvano mirror 303a and the second galvano mirror 304a are provided for deflection means.

A second optical system 402 and a third optical system 403 are the same configuration as the first optical system 401. A deflection direction of the laser beam is controlled by a rotating angle of the first galvano mirror and the second galvano mirror to be irradiated into a treated substance 307 on a stage 306. A beam diameter is optional because the group of lens 302 and if necessary a slit are provided, roughly speaking a round shape in several tens to several handreds of diameter, elliptical shape or rectangle shape is suitable. The stage 306 in FIG. 6 and FIG. 7 is fixed. Since the stage 306 can be synchronous with the scanning of laser beam, it is possible to be movable in the XYθ direction.

The first to third optical systems superpose the laser beam irradiated on the semiconductor film as the treated substance at an irradiated location, which causes required energy density for the laser annealing to be obtained, and light interference can be removed. The laser beams radiated from different laser oscillation apparatus have different phase angles so that interference can be reduced by superposition of the laser beams.

Though the configuration in which three laser beams radiated from the first to third optical systems are superposed is shown in the figures, the same effect is not limited to the number of laser beams, and the effect is achieved by superposition of a plurality of laser beams. And the configuration of the laser treatment apparatus is not limited to the configuration shown in FIG. 6 and FIG. 7 in case of the laser treatment apparatus having performance of the same effect as that shown in FIG. 6 and FIG. 7. In case that a beam profile has Gaussian distribution, superposing with its peak locations shifted slightly, the overlapped beam profile can be uniform.

Figure 8:
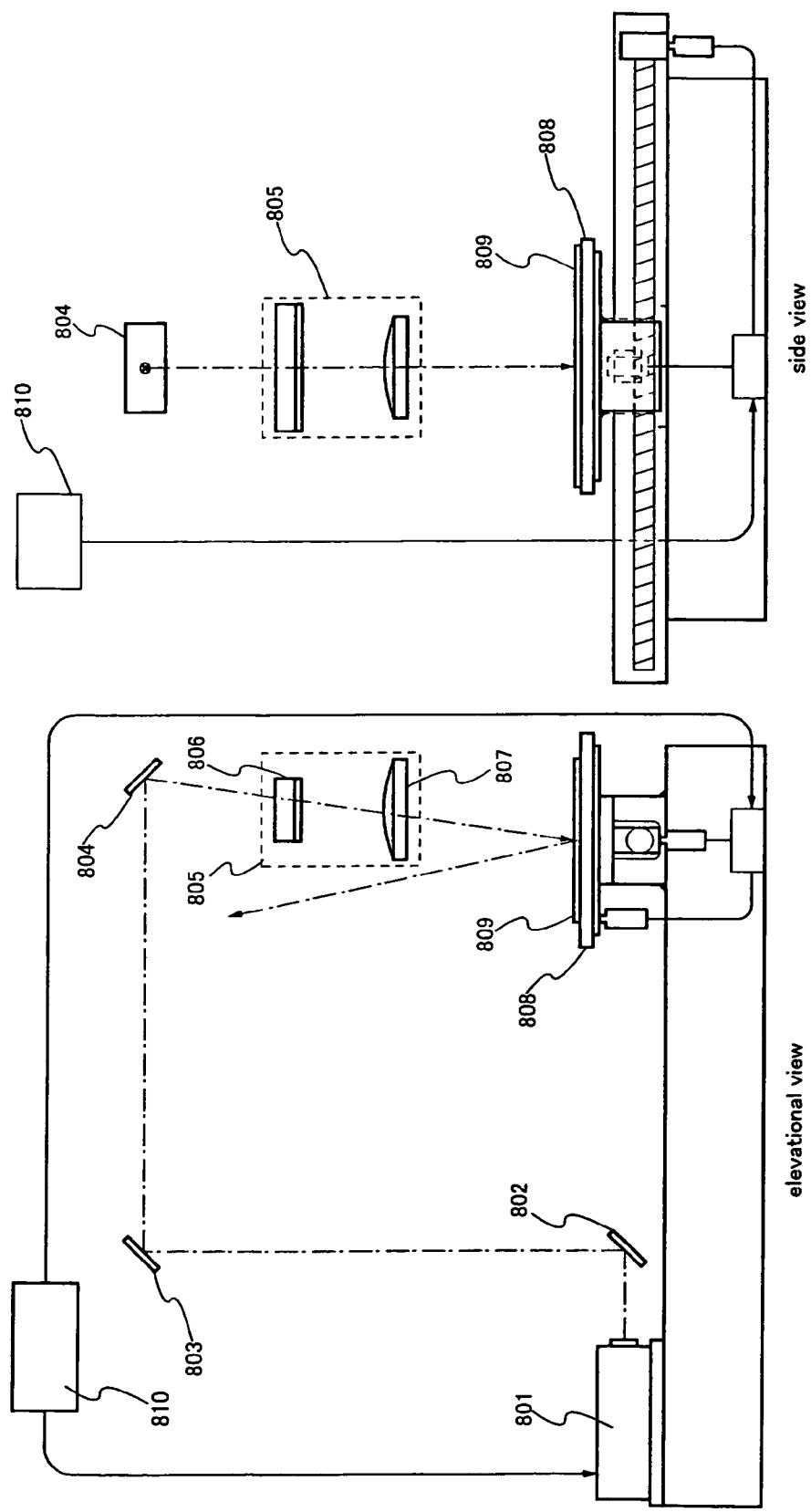
FIG. 8 is a configuration of a mode of a laser irradiation apparatus which is applied to the invention.

An apparatus having a configuration shown in FIG. 8 is applicable to as another configuration of the laser treatment apparatus. FIG. 8 shows an elevational view and a side view of a configuration of the laser treatment apparatus, which is constituted by a laser oscillation apparatus 801, high reflection mirrors 802 to 804, an optical system for forming elliptical beam 805 and a stage 808. An example of the optical system for forming elliptical beam 805 is a combination of a cylindrical lens 806 and a convex lens 807, the cylindrical lens 806 makes beam shape an ellipse, convex lens 807 is provided to condense the beam. Thus the laser beam is formed to the ellipse, which results in a wide irradiation area. This enables a treatment rate to be improved.

In this apparatus, the stage 808 is moving means, by moving biaxial direction, the laser annealing of a substrate 809 can be performed. It is possible to move continuously at a uniform rate of 10 to 80 cm/sec, and it is also possible to move in one direction within the longer range than one side of the substrate, in the other direction, discontinuous step feed whose movement is the same extent as a major axis of the elliptical beam can be performed. Oscillation of the laser oscillation apparatus 801 and the stage 808 are operated synchronously by a control unit 810 equipped with a microprocessor. A specific angle of an incident angle of the laser beam is selected, which prevents the laser beam (optical feed back) reflected on the substrate 809 from injecting the optical system again.

Figure 9:
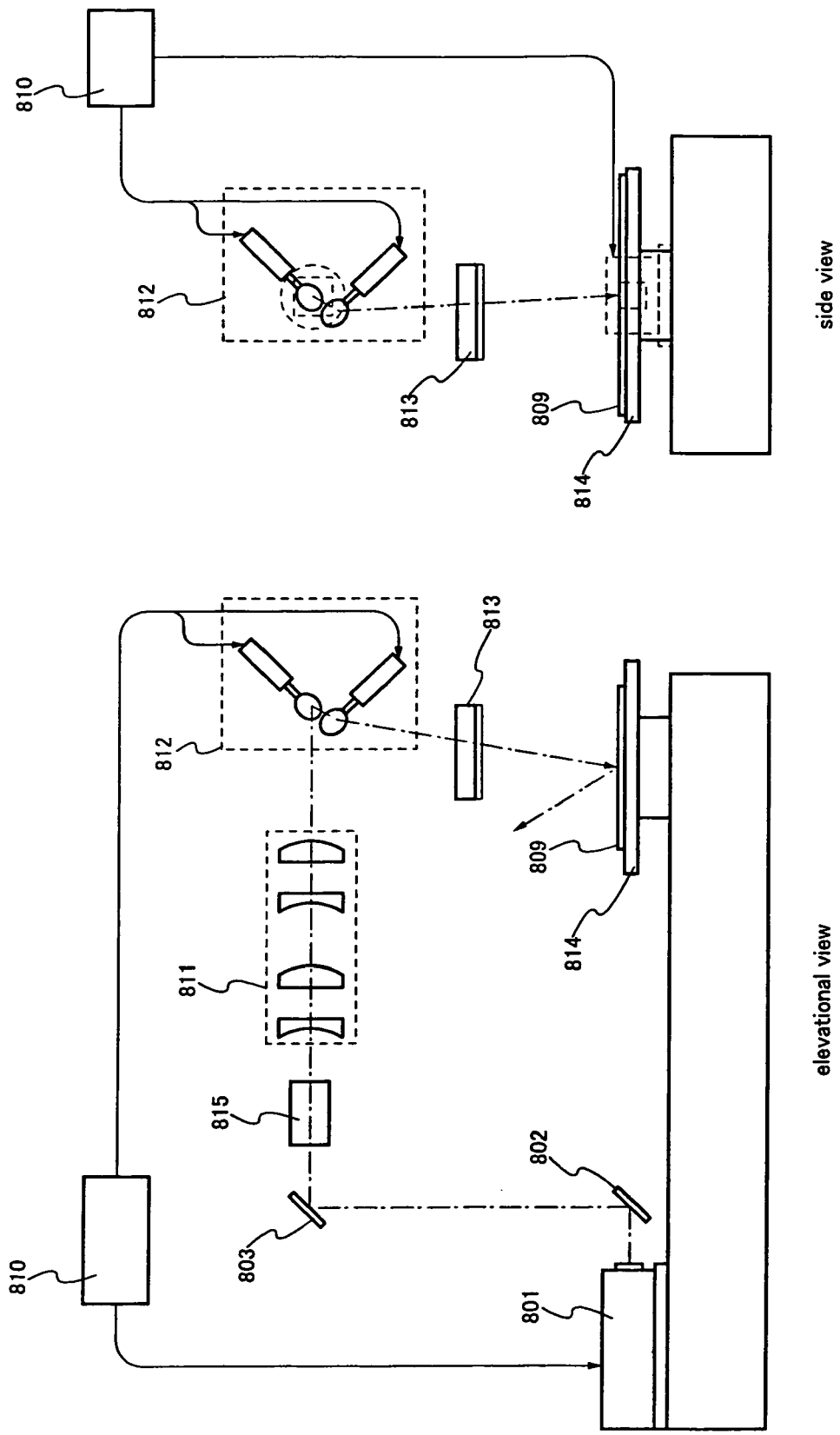
FIG. 9 is a configuration of a mode of a laser irradiation apparatus which is applied to the invention.

FIG. 9 shows an example of a mode which a stage 814 is fixed and the laser beam is scanned on a surface of a substrate 809. FIG. 8 shows an elevational view and a side view of a configuration of the laser treatment apparatus, which includes the laser oscillation apparatus 801, the high reflection mirrors 802 and 803, an optical system for forming elliptical beam 811, a pair of galvano mirrors capable of XY scan 812 and an fθ lens 813. An example of the optical system for forming elliptical beam 811 is a combination of a concave and a convex lens. Thus the laser beam is formed to the ellipse, which results in a wide irradiation area. This enables a treatment rate to be improved. A deflection direction is controlled by a rotating angle of the galvano mirror, which permits the laser beam to be irradiated to an optional location of the substrate 809 on a stage 814. Oscillation of the laser oscillation apparatus 801 and the pair of galvano mirrors 812 are operated synchronously by a control unit 810 equipped with a microprocessor. An isolator 815 prevents the laser beam (optical feed back) reflected on the irradiated surface from injecting the laser oscillation apparatus again to damage the optical system.

The laser treatment apparatus has the configuration as described above, the scanning direction of the laser beam and the channel length direction of TFT are in the almost same direction as described by FIG. 1A, the crystal orientation becomes single orientation, and the electrical field effect mobility can be improved. The seed region where the seed crystal having the controlled crystal surface is formed is provided, which enables the active layer having single orientation to be formed. In the top gate type of TFT, this permits dispersion of film quality of the gate insulating film formed on the active layer to be eliminated, and also dispersion of the threshold voltage can be reduced. The invention can be also applied to a bottom gate type of TFT (reverse stagger type).

EMBODIMENTS

A concrete example of a method for producing a semiconductor device according to the invention will be described in detail by way of embodiments with reference to the accompanying drawings.

Embodiment 1

The embodiment 1 is that fixed resist pattern is formed by photo-engraving in an amorphous silicon film formed on a substrate, a first semiconductor region is formed by etching treatment, a barrier film and a heat retaining film are formed over the first semiconductor region, and the first semiconductor region is crystallized by irradiation of a continuous wave laser beam from the substrate side.

In FIGS. 10A and 10B, on a glass plate 401 made of aluminosilicate glass, a barrier film 402 is formed by a silicon nitride-oxide film of 100 nm in thickness. A first semiconductor region 403 on the barrier film 402 is a 100 nm thick amorphous silicon film formed by a plasma CVD technique. Top and side surfaces of the first semiconductor region 403 are covered with a 200 nm thick silicon oxide film as a barrier film 404, and the silicon oxide film is covered with a 200 nm thick amorphous silicon film as a heat retaining film 405. FIG. 10A is a top view of the first semiconductor region 403 and FIG. 10B shows a sectional structure of the first semiconductor region 403 containing a substrate. Though implementation has not been done at this stage, as shown by dot lines, second semiconductor regions 407a and 407b forming an active layer of TFT should be formed within an edge portion of the first semiconductor region 403.

A seed region 406 is formed at one side in the longitudinal direction of the first semiconductor region 403. By scanning a laser beam from the seed region 406, a crystal surface appears in the seed region 406. This can become a crystal surface of the first semiconductor region 403.

FIGS. 11A and 11B show a crystallization stage by using a continuous wave laser beam. Irradiation area of the laser beam 409 may be smaller than area of the first semiconductor region 403, but the laser beam is irradiated in such a way that the scanning direction of the laser beam intersects the lateral direction of the first semiconductor region 403. Intersection is not always necessary in this case. The irradiation angle may have an intersection angle in the range of about 30 to about 90 degree.

A cross-sectional shape of the laser beam may be optionally such as rectangle, linear and elliptical. The laser beam is irradiated as shown in FIGS. 11A and 11B so that crystallization grows from one edge of the first semiconductor region 403 to the other edge. Any configuration of a laser processing machine shown in FIG. 6 to FIG. 9 can be adopted for the irradiation of the laser beam 409. The laser beam condensed by an optical system is irradiated on the first semiconductor region 403 and the heat retaining film 405 on the both sides of the first semiconductor region 403. The heat retaining film plays serves to prevent from proceeding another crystallization from the both side edge portions of the first semiconductor region 403 in such a way that the first semiconductor region 403 heated into a melting state by the irradiation of the laser beam is cooled rapidly after the irradiation of the laser beam.

Consequently, a crystal grows from the seed region 406 irradiated by laser beam 409 and a crystallized first semiconductor region 408 is formed.

The heat retaining film 405 is removed by consequent dry etching with nitrogen trifluoride ($NF_3$) and sulfur hexafluoride ($SF_6$) as shown FIG. 12A and FIG. 12B. The barrier film 404 is removed by water solution containing hydrofluoric acid so that the first semiconductor region 408 can be selectively remained. As shown in FIG. 12B, second semiconductor regions 407a and 407b are formed by etching the crystallized first semiconductor region 408. A top gate type of TFT can be formed by formations of a gate insulation film, a gate electrode and one conductive type of impurity region on the second semiconductor regions 407a and 407b. After that, wiring and interlayer dielectric and the like may be formed as occasion demands.

Functional constitution of an active matrix type of display apparatus in which a driving circuit using TFT is incorporated can be separated into a pixel portion and a driving circuit portion. In the TFT, by using the second semiconductor region formed by the embodiment 1 as an active layer, the pixel portion and the driving circuit portion can be formed on one substrate at the same time.

Figure 14:
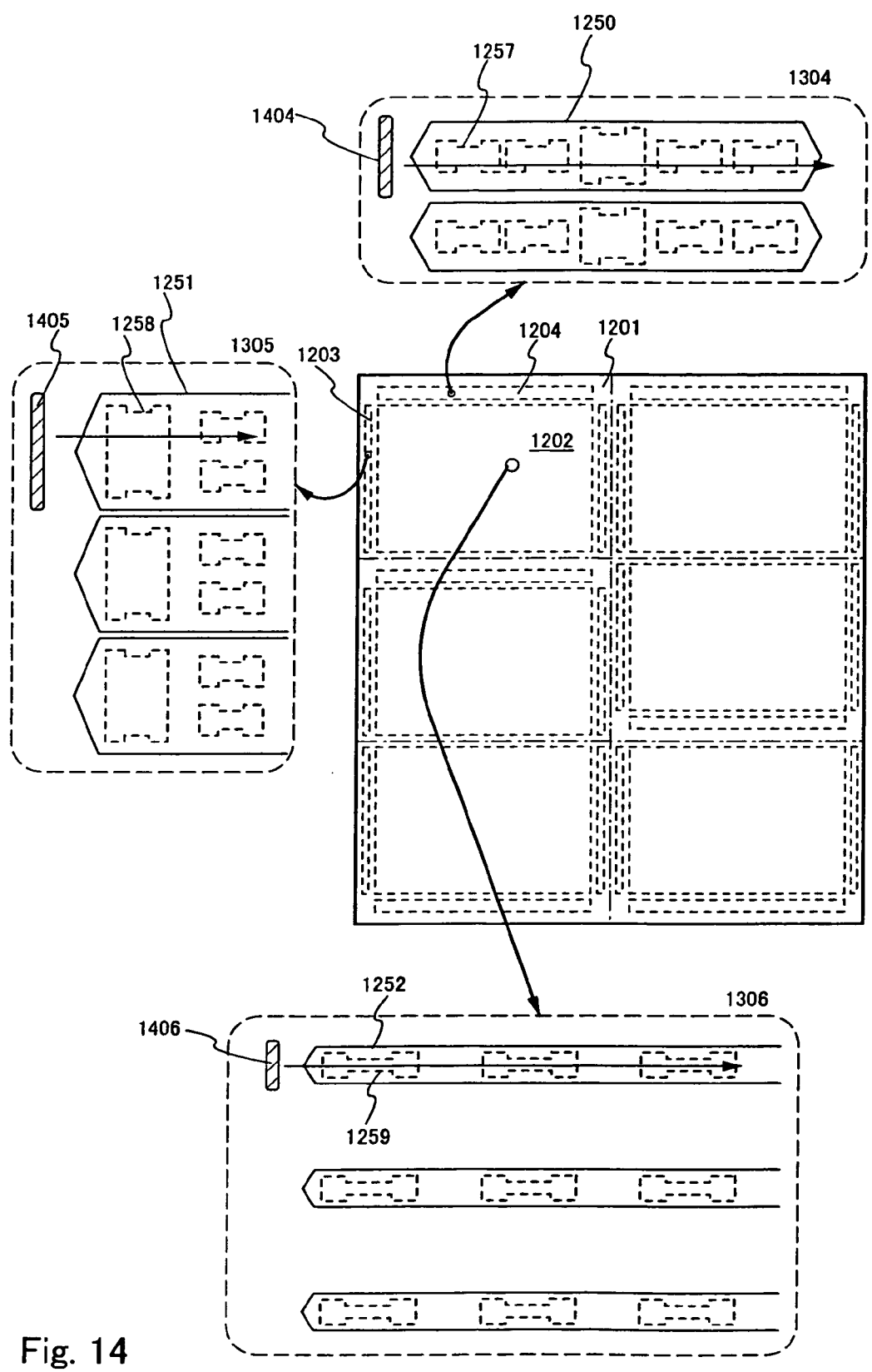
FIG. 14 shows a structure of a TFT substrate and relation between a configuration of a semiconductor region constituting TFT and a scanning direction of a laser beam.

FIG. 14 shows in detail a relation between a TFT substrate and the irradiation direction of the laser beam. A region where a pixel portion 1202 and driving circuit portions 1203 and 1204 are formed is shown by dotted lines on a TFT substrate 1201. The first semiconductor region is formed each region, and partially enlarged views 1304, 1305 and 1306 in FIG. 14 show a scanning method of the laser beam at this stage.

For example the driving circuit portion 1203 is a region forming a driving circuit for scanning lines, and in its partially enlarged view 1305 a first semiconductor region 1251 including a second semiconductor region 1258 (shown in dotted lines) is formed. An arrangement of the first semiconductor region 1251 permits a continuous wave laser beam 1405 to scan in the direction shown by an arrow. A shape of the second semiconductor region 1258 can be adopted optionally, however, a direction of channel length is aligned with the scanning direction of the laser beam.

The driving circuit portion 1204 which is provided in a direction to intersect the driving circuit portion 1203 is a formation region of a driving circuit for data lines and a first semiconductor region 1250 including a second semiconductor region 1257 is formed there. The scanning direction of a laser beam 1404 is aligned with the direction of channel length of a channel portion formed in the second semiconductor region 1257 (partially enlarged view 1304). The pixel portion 1202 is similar to the driving circuit portions as shown in the partially enlarged view 1306. A second semiconductor region 1259 is formed from a first semiconductor region 1252. The scanning direction of a laser beam 1406 is aligned with the direction of channel length of a channel portion formed in the second semiconductor region 1259. All the laser beams can be scanned in the same direction by this alignment, which permits processing time to be reduced.

As described above, the heat retaining film is formed in the first semiconductor region and the continuous wave laser beam is irradiated. This causes uniformly orientated crystal growth in which crystal grains extend in the scanning direction of the laser beam to be done. However, it is necessary to set properly detailed parameters such as scanning rate of the laser beam and energy density. This can be performed by setting the scanning rate of the laser beam in the range of 10 to 100 cm/sec. It is said that crystal growth rate through melting-solidification by a pulsed laser is 1 m/sec. The laser beam is scanned at slower rate than the rate of 1 m/sec and anneal is performed, which enables continuous crystal growth at solid-liquid interface and realization of larger grain size of the crystal.

Embodiment 2

The scanning of the laser beam in the embodiment 1 may be scanned not only in one direction but also back-and-forth strokes. In this case, the seed regions 406a and 406b may be provided at both sides of the first semiconductor region 403 as shown in the embodiment of FIGS. 13A and 13B. In case of back-and-forth strokes, laser energy density is changed every stroke so that the crystal growth can be phased. The scanning of the laser beam also serves for hydrogen extraction treatment which is often required in case of crystallization of amorphous silicon film. After hydrogen is extracted by scanning at low energy density at first, the crystallization may be performed by the second scanning at higher energy density. This producing method also results in a crystal semiconductor film which crystal grains extend in the scanning direction of the laser beam.

Embodiment 3

The embodiment 3 intends that an amorphous silicon film formed on a substrate is crystallized in advance and enlargement of a crystal grain by a continuous wave laser beam.

Figure 15A:
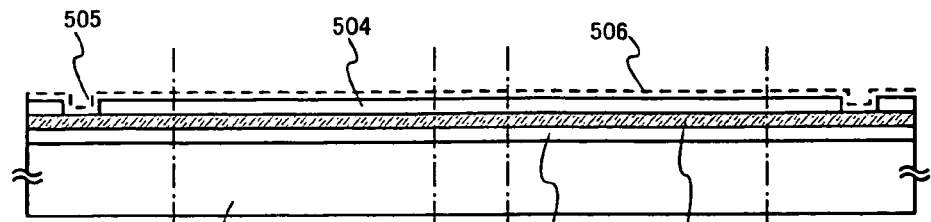
FIGS. 15A-15C are views illustrating a crystallization process according to an embodiment of the invention.

As shown in FIG. 15A, blocking layer 502 and a amorphous silicon film 503 are formed on a glass substrate 501 like the embodiment 1. A 100 nm thick oxide silicon film as a masking insulation film 504 is formed on the blocking layer 502 and the amorphous silicon film 503 by plasma CVD technique, and an opening 505 is provided. In order to add Ni as a catalytic element, water solution containing 5 ppm nickel acetate is spin-coated. Ni is in contact with the amorphous silicon film at the opening 505. A location where the opening 505 is formed is located in the seed region of the first semiconductor region which is formed later or out side of the seed region.

Figure 15B:
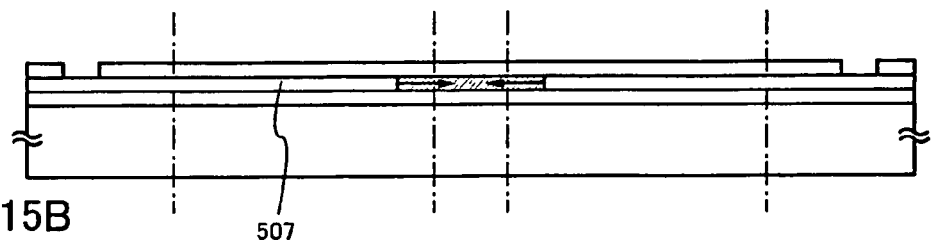

Then, as shown in FIG. 15B, the amorphous silicon film is crystallized by a 4 hours heat treatment at a temperature of 580° C. The crystallization grows by effect of the catalytic element from the opening 505 to the direction parallel to a substrate surface. A crystal silicon film 507 formed in such a way is constituted by aggregate of bar or needle crystals. Each crystal is grown macroscopically with a specific directional property so that crystalline orientation is uniform. The crystal silicon film 507 is characterized by having a higher orientation ratio of a specific direction.

Figure 15C:
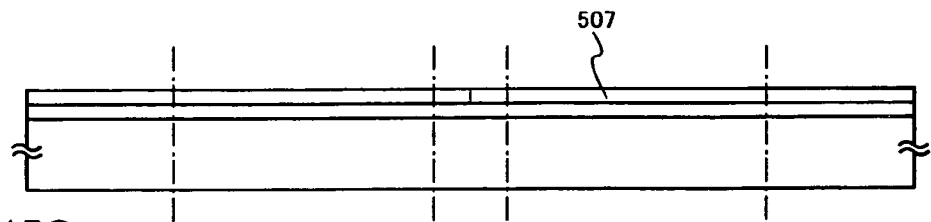

Finishing heat treatment, the masking insulation film 504 is removed by etching so that the crystal silicon film 507 can be obtained as shown in FIG. 15C.

Figure 16A:
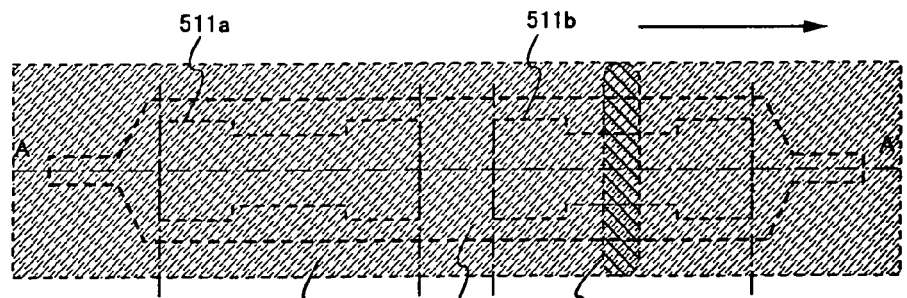
FIGS. 16A and 16B are views illustrating a crystallization process according to an embodiment of the invention.
Figure 16B:
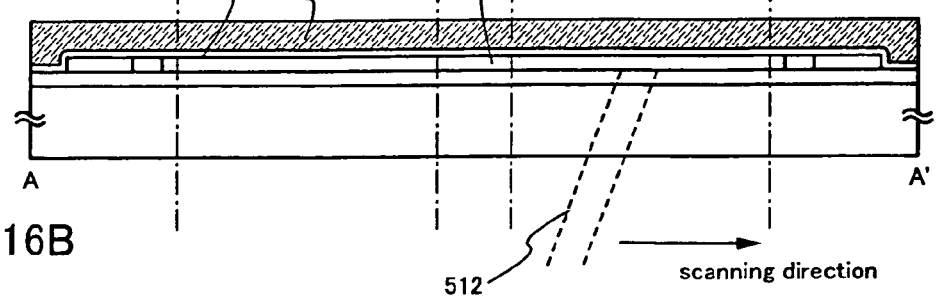

The crystal silicon film 507 is etched into a fixed pattern by photoetching as shown in FIGS. 16A and 16B to form a first semiconductor region 508. Then a barrier film 509 is formed by a 20 nm thick silicon oxide film and heat retaining film 510 is formed by a 250 nm thick amorphous silicon film. A region where second semiconductor regions 511a and 511b should be formed as an active layer of TFT is located inside of the first semiconductor region 508. The region is irradiated from a substrate side by using a continuous oscillated second harmonic (532 nm) of Nd:YVO4 laser oscillation machine. As shown in FIGS. 16A and 16B, a continuous wave laser beam 512 is scanned in one direction or back-and-forth strokes.

The crystal silicon film is melted by such an irradiation of the laser beam to be recrystallized. With this recrystallization, crystal growth which crystal grains extend in the scanning direction of the laser beam occurs. In this case, the crystal silicon film having uniform crystal faces is formed in advance so that precipitation of a crystal having a different crystal face and creation of dislocation can be prevented. In embodiments described below, the TFT can be formed by the same treatments as the embodiment 1.

Embodiment 4

Figure 17A:
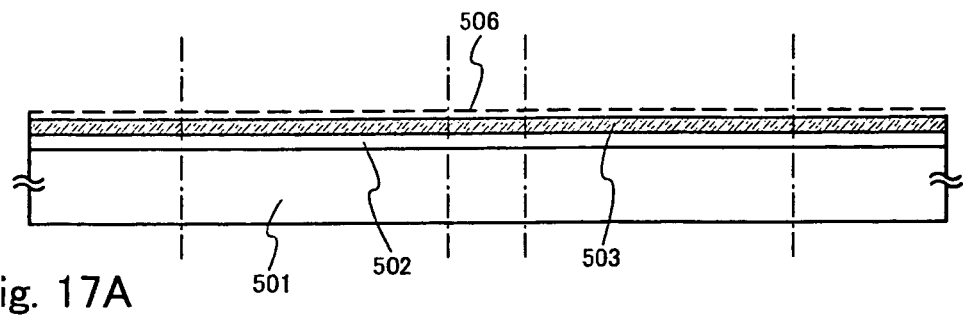
FIGS. 17A and 17B are views illustrating a crystallization process according to an embodiment of the invention.

In the same way as the embodiment 3, the glass substrate 501, the blocking layer 502 and the amorphous silicon film 503 are formed, then Ni as the catalytic element is added over the surface. The method for adding Ni is not limited so that different method such as spin coating, vapor deposition and sputtering can be adopted. In case of the spin coating method, water solution containing 5 ppm nickel acetate is applied to form a layer including catalytic element 506 (FIG. 17A).

Figure 17B:
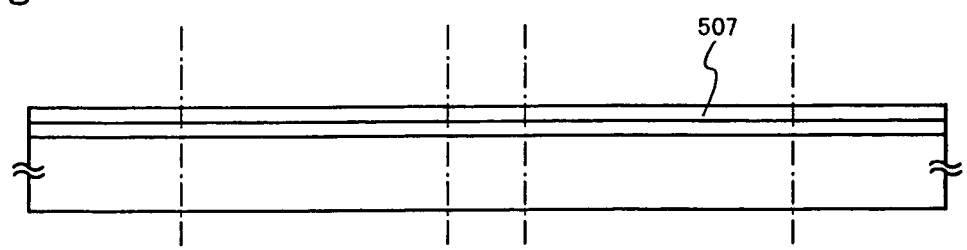

Then the amorphous silicon film 503 is crystallized by the 4 hours heat treatment at a temperature of 580° C. Consequently, the crystal silicon film 507 is obtained as shown in FIG. 17B. The crystal silicon film 507 formed is also constituted by aggregate of bar or needle crystals. Each crystal is grown macroscopically with a specific directional property so that crystalline orientation is uniform. The crystal silicon film 507 is characterized by having a higher orientation ratio of a specific direction. Processes after the heat treatment can be treated in the same way as the embodiment 3.

Embodiment 5

Figure 18:
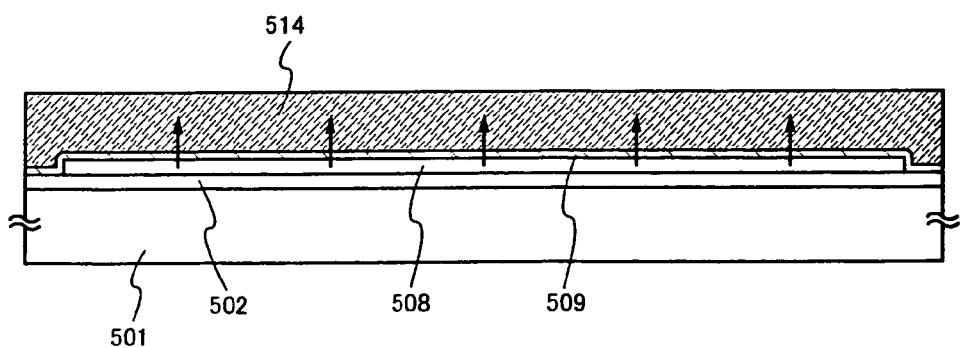
FIG. 18 is a view illustrating a crystallization process according to an embodiment of the invention.

In the embodiment 3 or the embodiment 4, removal process of the remaining catalytic element of not lower than $10^{19}/cm^3$ in concentration by means of gettering treatment can be added after the forming of the first semiconductor region 508. As shown in FIG. 18, a barrier film 509 is remained on the first semiconductor region 508 and an amorphous silicon film added argon of $1\times10^{20}/cm^3$ to $1\times10^{21}/cm^3$ is formed as a gettering site 514 on the barrier film 513.

By a heat treatment at a temperature of 600° C. for 12 hours in a furnace annealing oven or a heat treatment at temperatures of 650 to 750° C. for 30 to 60 min. by lamp annealing or gas heat annealing, Ni added into the crystal silicon film 507 as the catalytic element can be segregated in the gettering site 514. This treatment allows the concentration of the catalytic element in the crystal silicon film 507 to be lower than $10^{17}/cm^3$.

The gettering site 514 is selectively etched. In this step, the barrier film 509 can be used as an etching stopper when each of the heat retaining film 510 and the gettering site is selectively etched. After finishing the gettering treatment, processes can be proceeded in the same way as the embodiment 3 or the embodiment 4.

Embodiment 6

Figure 19A:
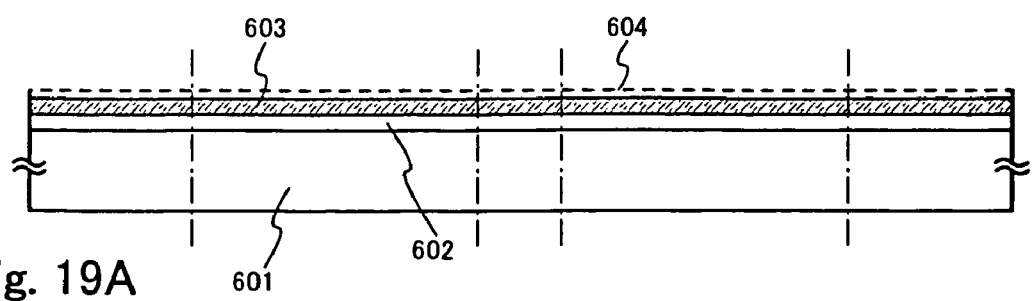
FIGS. 19A-19C are views illustrating a crystallization process according to an embodiment of the invention.
Figure 19B:
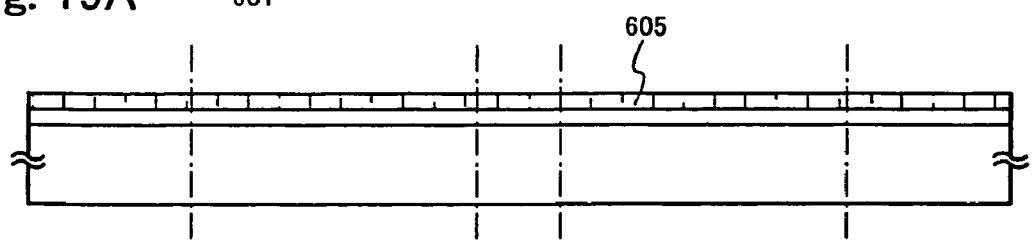

Crystal orientation in a first semiconductor region can be uniform in a manner that a crystal semiconductor film having the fixed crystal orientation is formed in advance in a seed region. As shown in FIG. 19A, a blocking layer 602 is formed on a glass substrate 601, and an amorphous silicon film 603 is formed on the blocking layer 602. It is not necessary to obtain too thick the amorphous silicon film 603 for a purpose of forming a seed region by crystallization. Therefore it is sufficient to be formed at thickness in the range about 30 to about 100 nm. Then a layer including catalytic element 604 is formed. This forming method can be performed in the same way as the embodiment 3 or the embodiment 4.

Figure 19C:
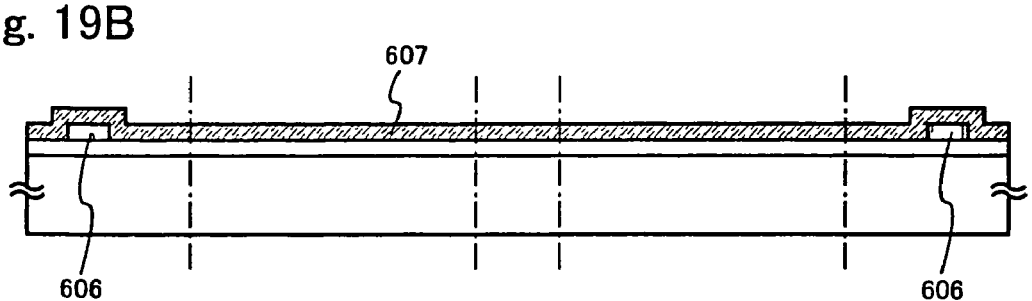

By a heat treatment for crystallization, a crystal silicon film 605 is obtained. The gettering treatment may be done at this stage in the same way as the embodiment 5. The crystal silicon film 605 is etched into a fixed pattern by photoetching to form a seed crystal 606 which is located in the seed region as shown in FIG. 19C. A 150 nm thick amorphous silicon film 607 is formed over the glass substrate 601.

Figure 20A:
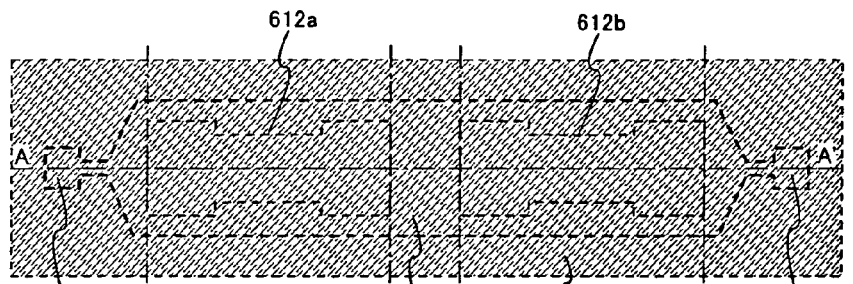
FIGS. 20A and 20B are views illustrating a crystallization process according to an embodiment of the invention.
Figure 20B:
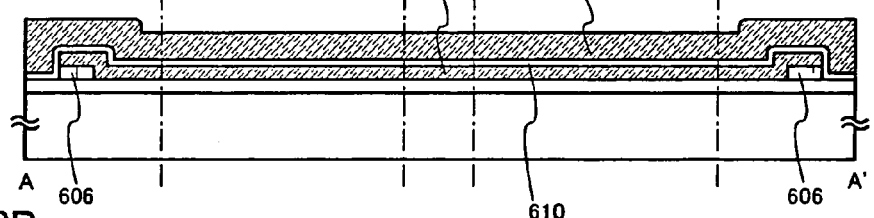

The amorphous silicon film 607 is etched into a fixed pattern by photoetching to form a first semiconductor region 608 as shown in FIGS. 20A and 20B. A seed region 609 is formed at an edge portion of the first semiconductor region 608. The seed crystal 606 is already formed in the region to overlap the seed region 609. A region where second semiconductor regions 612a and 612b shown by dotted lines are formed is arranged inside of the first semiconductor region 608. A barrier film 610 and a heat retaining film 611 are formed on the first semiconductor region 608.

Figure 21A:
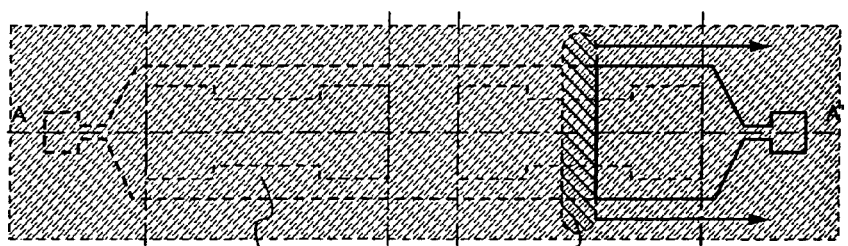
FIGS. 21A and 21B are views illustrating a crystallization process according to an embodiment of the invention.
Figure 21B:
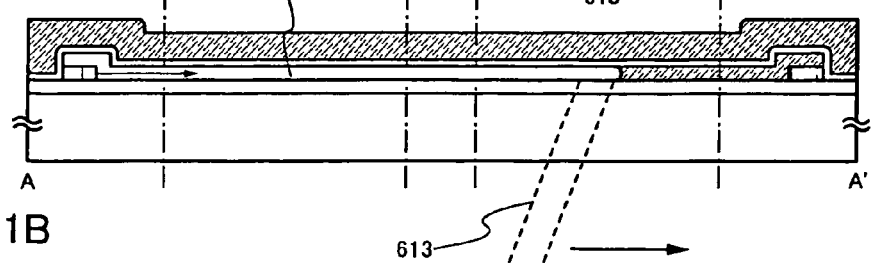

A continuous wave laser beam 613 is scanned from one edge of the first semiconductor region to the other to crystallize the region as shown in FIGS. 21A and 21B. The continuous wave laser beam 613 is scanned from the seed region 609 so that a crystallized region 614 to be formed can be formed to have the same crystal orientation as the seed crystal 606. The heat retaining film can prevent from proceeding another crystallization from the both side edge portions of the first semiconductor region in such a way that the first semiconductor region heated into a melting state by the irradiation of the laser beam is cooled rapidly after the irradiation of the laser beam.

Figures 22A, 22B:
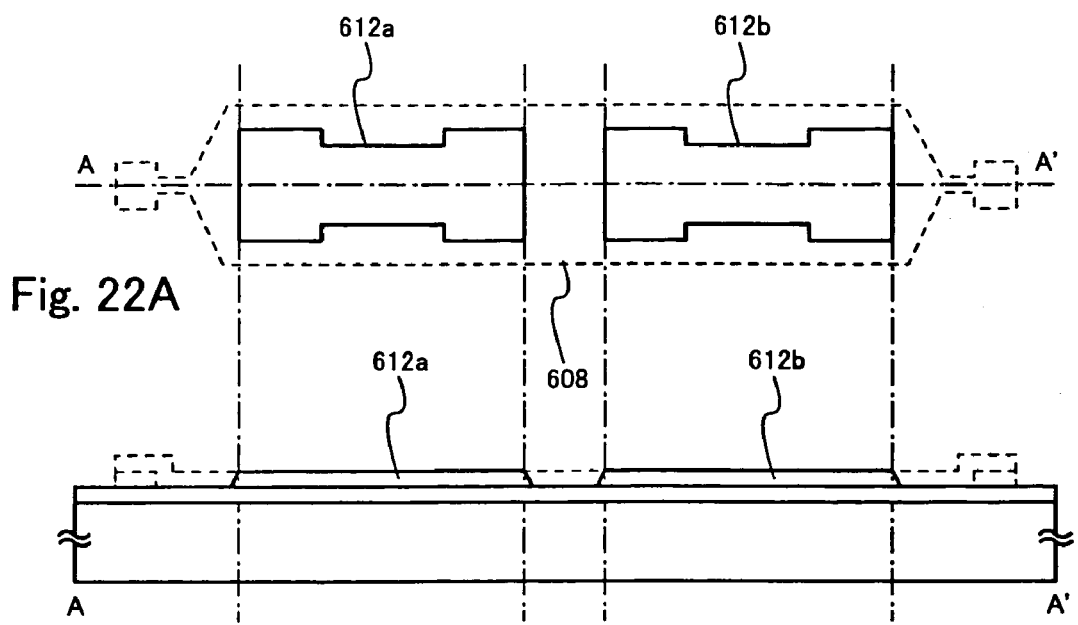
FIGS. 22A and 22B are views illustrating a crystallization process according to an embodiment of the invention.

As shown in FIGS. 22A and 22B, the crystallized first semiconductor region 608 is etched by photoetching into a fixed pattern which the second semiconductor regions 612a and 612b should be formed. A top gate type of TFT can be obtained by forming a gate insulating film, a gate electrode and one conductive type of impurity region on the second semiconductor regions 612a and 612b. Then wiring and interlayer dielectric and the like may be formed as occasion demands.

Embodiment 7

In the embodiment 6, the seed crystal 606 can also be formed by a crystalline silicon film including germanium. This means that an amorphous silicon film including germanium at concentrations in the range of 0.1 to 10 at %, preferably 1 to 5 at % instead of the amorphous silicon film in FIG. 19A is formed. Other treatments can be done in the same way as the embodiment 6.

One of advantages of employing the crystal silicon film including germanium is higher orientation ratio, which causes the orientation ratio of {101} face to be raised up to 40 to 90%. The orientation ratio of the first semiconductor region can be raised in a manner that the seed crystal is formed by the crystalline silicon film.

Embodiment 8

According to any one of the embodiments 1 to 7, the gettering treatment described in the embodiment 5 can be done in the first semiconductor region which is crystallized by the continuous wave laser beam. A method of the gettering treatment is the same as that of the embodiment 5. Contaminated and segregated metallic impurities during the crystallization can be removed by performing the gettering treatment.

Embodiment 9

In the embodiment 9, an example producing a CMOS type of TFT by using the second semiconductor region which is formed in the embodiments 1 to 8 will be described referring to FIGS. 23A-23C.

Figure 23A:
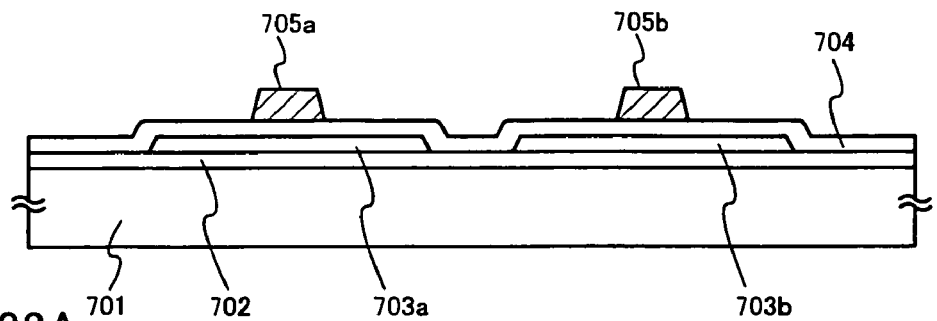
FIGS. 23A-23C are cross-sectional views illustrating a manufacturing process of TFT which has a CMOS structure.

FIG. 23A shows a state which second semiconductor regions 703a and 703b as the active layer, a gate insulating film 704 and gate electrodes 705a and 705b are formed on a glass substrate 701 and a formed blocking layer 702. The gate insulating film 704 of 80 nm in thickness is formed in a manner that a silicon nitride oxide film is made from $SiH_4$, $N_2O$ and $O_2$ as reaction gas by plasma CVD method. Because an orientation ratio of crystals in the second semiconductor regions 703a and 703b is high, dispersion of film quality of the gate insulating film formed on the second semiconductor regions can be reduced. This causes dispersion of threshold voltage of TFT to be reduced. Electrically conductive materials such as Al, Ta, Ti, W and Mo or alloys of these metallic elements are suitable for a material of which the gate electrodes 705a and 705b are made. The gate electrodes are formed 400 nm in thickness. Al may be used as the gate electrodes and an oxide film is formed on its surface by anodic oxidation to be stabilized.

Figure 23B:
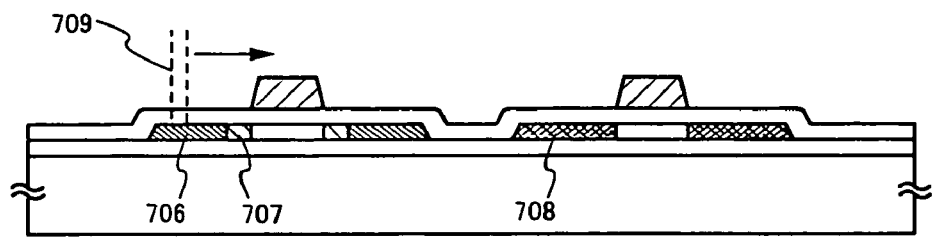

FIG. 23B shows a formation of an impurity region which a source or drain region 706 for an n-channel type of TFT, an LDD region 707, and a source or drain region 708 for p-channel type of TFT are formed by ion doping method.

Crystalline structure is destroyed to become amorphous structure in a region where impurity elements are injected by the ion doping. In order to recover the crystalline structure and realize lower electrical resistance by activating the impurity elements, laser treatment is performed. The laser treatment can be done by the laser treatment machine according to the invention. Hydrogenation may be carried out at the same time in a manner that laser irradiation is done in a hydrogen atmosphere (reducing atmosphere).

Figure 23C:
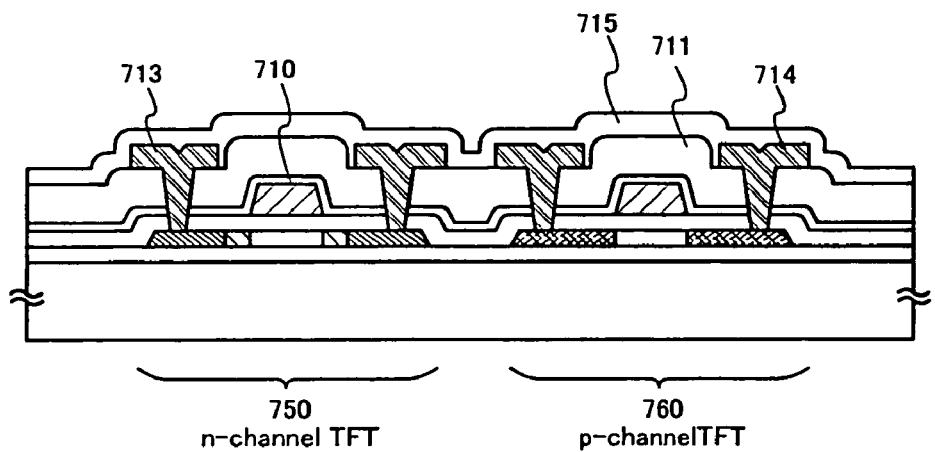

A first interlayer dielectric 710 is formed by a silicon nitride film or a silicon oxide film as shown in FIG. 23C. Furthermore, a second interlayer dielectric 711 is formed by organic resin material or low dielectric constant material having a dielectric constant not more than 4. Acrylic and polyimide are useful for the organic resin material. SiOF, polyarylethers, BCB (benzocyclobutene), fluoride polyimide, a-CF are useful for the low dielectric constant material. A contact hole reaching to an impurity region of each semiconductor layer is formed, then wirings 713 and 714 are formed by using Al, Ti and Ta. A passivation film 715 is formed by a silicon nitride film.

As described above, an n-channel type of TFT 750 and a p-channel type of TFT 760 are obtained. Though each TFT is shown as a single element in FIG. 23C, not only a CMOS circuit but also a single channel type of NMOS circuit and a PMOS circuit can be constructed by these TFTS. In the second semiconductor region according to the invention, crystal growth is made parallel to a direction of channel length so that a grain boundary which a carrier crosses is substantially eliminated. This permits high electric field effect mobility to be obtained. The TFT thus produced can be used for producing an active matrix type of liquid crystal display apparatus and a display apparatus having a light-emitting device and also used as a TFT which a memory or a microprocessor is formed on a glass plate.

Embodiment 10

Figure 24:
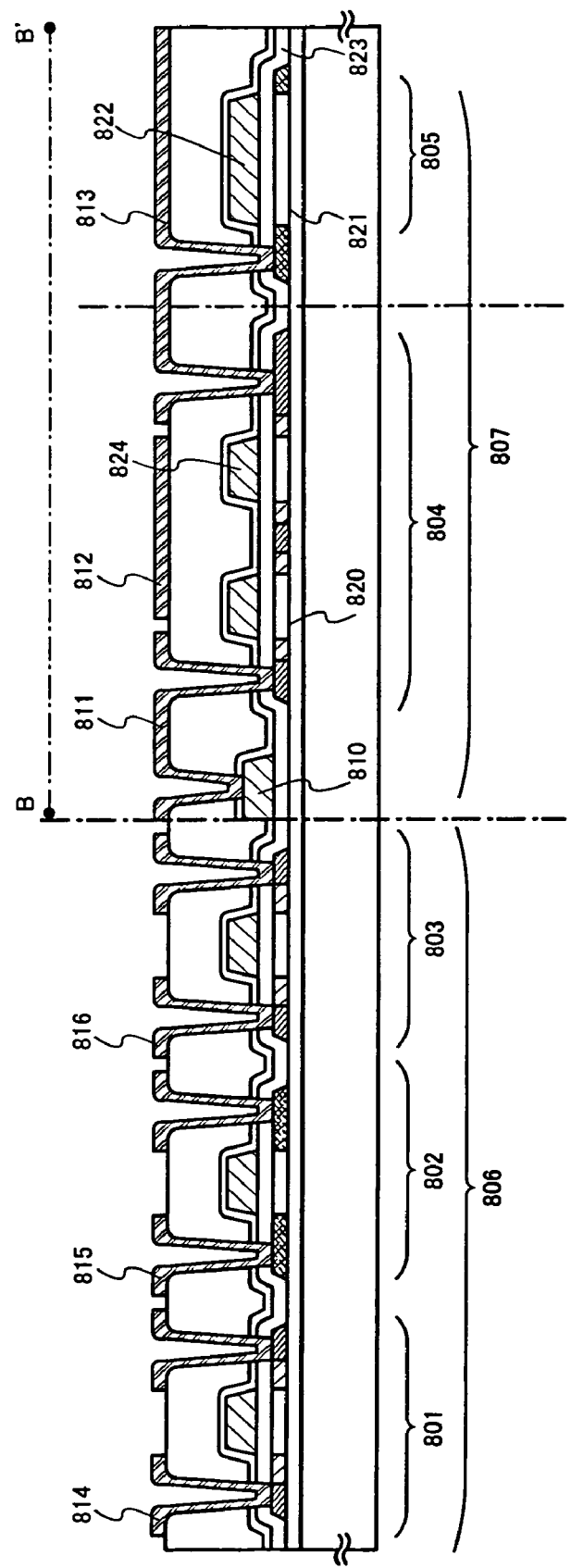
FIG. 24 is a cross-sectional view showing a structure of a TFT substrate.
Figure 25:
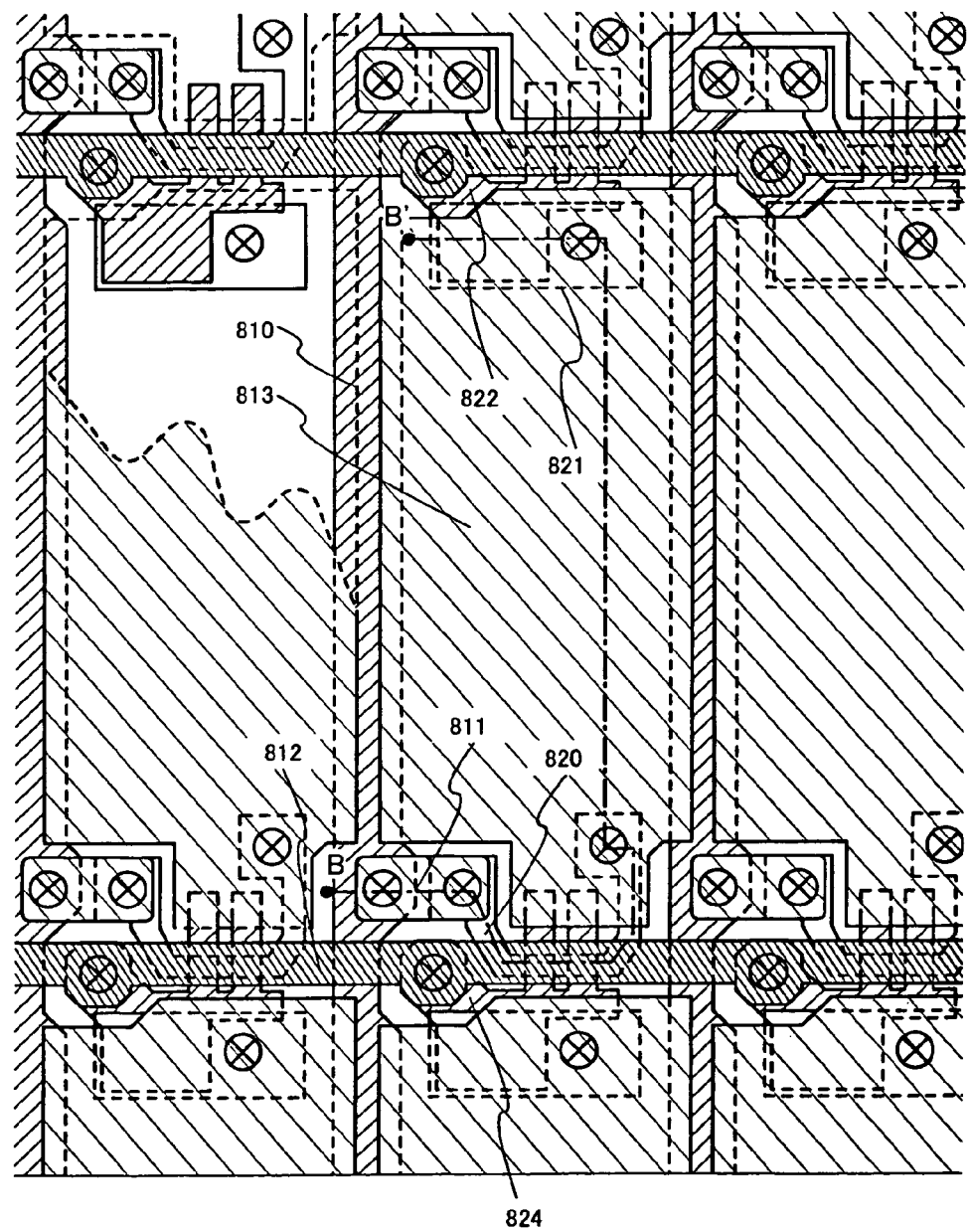
FIG. 25 is a top view showing a structure of a TFT substrate.

An embodiment of constitution of a TFT substrate (substrate on which TFT is formed) for realizing an active matrix driving type of display apparatus by employing TFT produced in the same way as the embodiment 9 will be described referring to FIG. 24. FIG. 24 shows a cross-sectional view which an n-channel type of TFT 801, a p-channel type of TFT 802, a driving circuit portion 806 having an n-channel type of TFT 803 and an n-channel type of TFT 804, a pixel portion 807 having a capacitor element 805 are formed on one substrate. FIG. 25 is a top view and a cross-sectional structure according to line B-B' of FIG. 24 corresponds to a longitudinal cross-sectional view of the pixel portion 807 shown in FIG. 24.

The n-channel type of TFT 801 in the driving circuit portion 806 has structure which an LDD region overlapped a gate electrode is provided in the n-channel type of TFT 750 described in the embodiment 9 of FIG. 23C. The structure suppresses degradation by hot carrier effect. The p-channel type of TFT 802 is a similar shape to the p-channel type of TFT 760 and is single drain structure. A shift register circuit, a buffer circuit, a level shifter circuit and a latch circuit can be formed by the n-channel type of TFT and the p-channel type of TFT. The n-channel type of TFT 803 has LDD structure like the n-channel type of TFT 750 shown in FIG. 23C. The LDD structure is suitable for a sampling circuit by reducing off current.

The second semiconductor region which an impurity region such as a channel forming region and an LDD region is formed in the TFT is formed by proper combination of the methods shown in the embodiment 1 to the embodiment 8. Crystal growth in the second semiconductor region is directed to the channel length direction (or, the direction parallel to the substrate and toward the channel length direction) so that a probability which a carrier crosses a grain boundary is extremely reduced. This permits high electric field effect mobility and quite excellent characteristics to be obtained. Reference numerals 814 to 816 are wirings connected to a source or a drain of each TFT.

A semiconductor region 820 is formed as the active layer in the n-channel type of TFT 804 of the pixel portion 807, the n-channel type of TFF 804 has structure which the TFTs of LDD structure are connected in series, one end of the n-channel type of TFT 804 is connected to a data line 810 through a connecting wiring 811 and the other is connected to a pixel electrode. A gate line 812 is electrically connected to a gate electrode 824. An impurity region where boron is added is formed in a semiconductor region 821 functioning as one electrode of a capacitor element 805. The capacitor element 805 has an insulating film 823 (the same film as the gate insulating film) as a dielectric and is constituted by a capacitor electrode 822 and a semiconductor region 821. The semiconductor regions 820 and 821 correspond to the second semiconductor region formed in the embodiments 1 to 8.

In these TFTs, the orientation ratio of the second semiconductor region which forms the channel forming region or the impurity region is high and flat so that dispersion of film quality of the gate insulating film formed on the second semiconductor region can be reduced. This permits dispersion of threshold voltage of the TFT to be reduced. As a result, it is possible to drive the TFT with low voltage and there is an advantage of reduction of electric power consumption. Because its surface is flattened, electric field does not concentrate on a convex portion. Consequently, it is possible to suppress degradation caused by hot carrier effect generated particularly at drain edge. Though concentration distribution of the carrier flowing between the source and the drain becomes high near interface of the gate insulating film, the carrier is not scattered and moves smoothly by smoothing, which results in higher electric field effect mobility.

In order to produce a liquid crystal display apparatus from the TFT substrate, it is necessary to provide a counter substrate on which a common electrode is formed facing each other with a distance of about 3 to about 8 μm, and to form an orientation film and a liquid crystal layer. It is possible to adopt those of the prior art.

Figure 26:
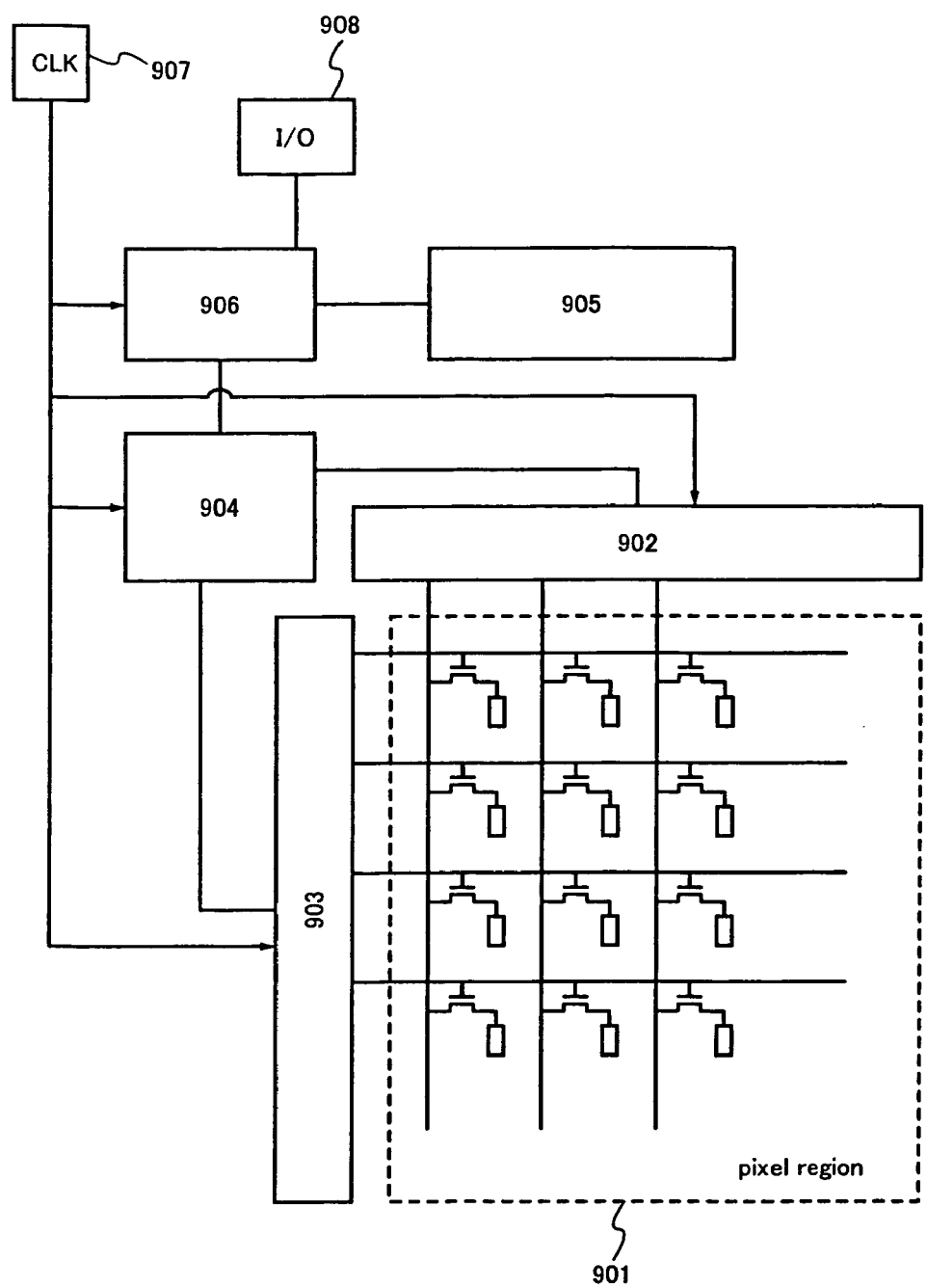
FIG. 26 is a block diagram showing an example of a circuit configuration of a TFT substrate.

FIG. 26 shows a circuit configuration of such an active matrix substrate. A driving circuit portion for driving TFT 900 in a pixel portion 901 includes a data line driving circuit 902 and a scanning line driving circuit 903, and a shift register circuit, a buffer circuit, a level shifter circuit and a latch circuit are arranged if necessary. In this case, the scanning line driving circuit 903 provides a video signal, and the video signal from a controller 904 and a timing signal for the scanning line driving circuit from a timing generator 907 are inputted into the scanning line driving circuit 903. A timing signal for data line driving circuit from the timing generator 907 is inputted into the data line driving circuit 902, and the data line driving circuit 902 outputs a signal to a scanning line. A microprocessor 906 performs control of a controller 904, data input of video signal into a memory 905, input into and output from an external interface 908, and operational management of total system.

TFT for forming the circuit can be formed by the TFT having structure shown in the embodiment 10. The second semiconductor region forming a channel forming region of the TFT is made a region regarded as a substantial single crystal, which permits characteristics of the TFT to be improved, and various functional circuits can be formed on a substrate such as glass.

Embodiment 11

Figure 27A:
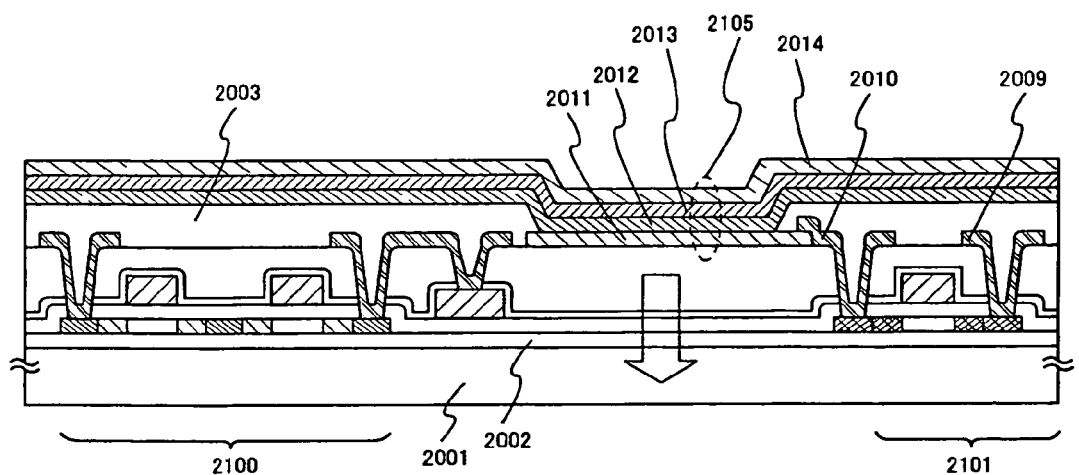
FIGS. 27A and 27B are cross-sectional views showing a structure of a pixel element of a semiconductor device which is provided with a light-emitting device.
Figure 27B:
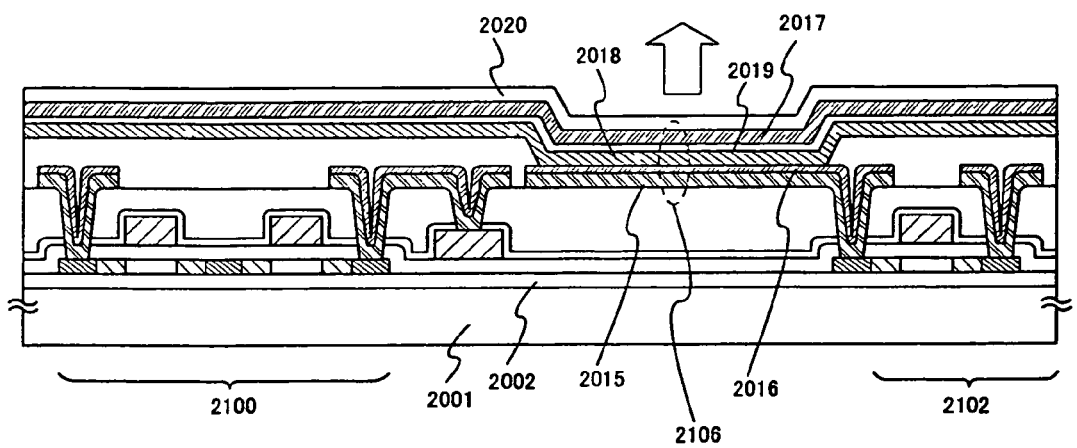

An example of a display apparatus using a light-emitting device as another embodiment using a TFT substrate will be described referring to drawings. FIGS. 27A and 27B are sectional views showing a pixel element structure of a display apparatus in which the TFT is arranged in each pixel element. N-channel type of TFTs 2100 and 2102 and a p-channel type of TFT 2101 shown in FIGS. 27A and 27B have the same structure as that in the embodiment 9, so that detailed description is omitted in the embodiment 11.

FIG. 27A shows a structure in which the n-channel type of TFT 2100 and the p-channel type of TFT 2101 are formed as a pixel element on a substrate 2001 through a blocking layer 2002. In this case, the n-channel type of TFT 2100 is a TFT for switching, the p-channel type of TFT 2101 is a TFT for current control and its drain side is connected to one of electrodes of a light-emitting element 2105. A purpose of the p-channel type of TFT 2101 is to control current to the light-emitting element. There is no limit of the number of TFT provided in one pixel element, and proper circuit configuration can be selected according to a driving method of a display apparatus.

The light-emitting element 2105 shown in FIG. 27A includes an anode layer 2011, an organic compound layer 2012 having an emitter and a cathode layer 2013, and a passivation layer 2014 is formed on the light-emitting element 2105. The organic compound layer includes a light-emitting layer, a hole injected layer, an electron injected layer, a hole transport layer and an electron transport layer. In luminescence of an organic compound, there are two kinds of the light-emitting, that is to say light-emitting in case of going back from a singly excited state to a ground state (fluorescence) and from a triply excited state to the ground state (phosphorescence), and the luminescence of the organic compound includes one of light-emittings or both of them.

Materials having high work function such as indium oxide, tin oxide and zinc oxide are used for a material forming the anode, and materials having low work function such as alkaline metals or alkaline earth metals including MgAg, AlMg, Ca, Mg, Li, AlLi and AlLiAg, typically magnesium compounds are used for the cathode. The cathode may also be constituted by a 1 to 20 nm thick combination layer of a lithium fluoride layer and an Al layer or a thin combination layer of a cesium layer and an Al layer. The anode is connected to a wiring 2010 of a drain side of the p-channel type of TFT 2101, a partition wall layer 2003 is formed to cover an end portion of the anode 2011.

The passivation layer 2014 is formed on the light-emitting element 2105. The passivation layer 2014 is made from a material, which has high barrier characteristics against oxygen or vapor, such as silicon nitride, silicon nitride oxide and diamond like carbon (DLC). This constitution enables light emitted from the light-emitting element to be radiated from the anode side.

On the other hand, FIG. 27B shows a structure in which the n-channel type of TFT 2100 and the n-channel type of TFT 2102 are formed as a pixel element on a substrate 2001 through a blocking layer 2002. In this case, the n-channel type of TFT 2100 is a TFT for switching, the n-channel type of TFT 2102 is a TFT for current control and its drain side is connected to one of electrodes of a light-emitting element 2106.

In the light-emitting element 2106, a film 2016 whose material has high work function as an anode material such as indium oxide, tin oxide and zinc oxide is formed on a wiring 2015 connected to a drain side of the n-channel type of TFT 2102, and an organic compound layer 2018 is formed on the film 2016.

A cathode structure includes a first cathode layer 2019 made from an 1 to 2 nm thick material having low work function, and a second cathode layer 2017 provided thereon for reducing resistance of the cathode. Alkaline metals or alkaline earth metals including cesium, alloys of cesium and silver, lithium fluoride, MgAg, AlMg, Ca, Mg, Li, AlLi and AlLiAg, typically magnesium compounds are used for the first cathode layer 2019. A 10 to 20 nm thick metallic material such as Al and Ag or a 10 to 100 nm thick transparent conducting film such as indium oxide, tin oxide and zinc oxide is used for the second cathode layer 2017. A passivation film 2020 is formed on the light-emitting element 2106. This constitution enables light emitted from the light-emitting element to be radiated from the cathode side.

Another mode of the light-emitting element 2106 in FIG. 27B may include a cathode layer 2016 whose material is alkaline metals or alkaline earth metals including cesium, alloys of cesium and silver, lithium fluoride, MgAg, AlMg, Ca, Mg, Li, AlLi and AlLiAg, typically magnesium compounds, as a cathode material which is formed on the wiring 2015 connected to the drain side of the n-channel type of TFT 2102, an organic compound layer 2018, an about 1 to 2 nm thick first anode layer 2019, and a second anode layer 2017 formed by a transparent conducting film. The first anode layer is made from a material having high work function such as nickel, platinum and lead by using vacuum evaporation method.

As described above, the display apparatus utilizing the light-emitting element of active matrix drive can be made. In these TFTs, the orientation ratio of the second semiconductor region which forms the channel forming region or the impurity region is high and flat so that dispersion of film quality of the gate insulating film formed on the second semiconductor region can be reduced. This permits dispersion of threshold voltage of the TFT to be reduced. As a result, it is possible to drive the TFT with low voltage and there is an advantage of reduction of electric power consumption. In the display apparatus, high performance of current driving of the TFT for current control, which is connected to the light-emitting element is required, so that the TFT is suitable for the use of the display apparatus. Configuration, not shown here, in which driving circuit portion is provided in the vicinity of the pixel portion may be the same as in the embodiment 10.

Embodiment 12

The invention can be applied for various semiconductor devices. The semiconductor devices include a mobile information terminal (an electronic note, a mobile computer, a cellular phone and so on), a video camcorder, a digital camera, a personal computer, a television set and a projection type of display apparatus. Examples are shown in FIGS. 28A-28G, 29A-29D and 30.

Figure 28A:
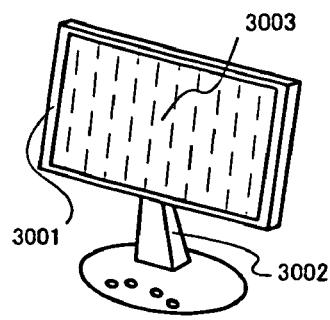
FIGS. 28A-28G are examples of an electronic apparatus which is provided with a semiconductor device according to the invention.

FIG. 28A is a television set as an example according to the invention, and the television set is constituted by a housing 3001, a support 3002 and a display portion 3003. A produced TFT substrate according to the invention is applied to the display portion 3003, and the television set can be completed by the invention.

Figure 28B:
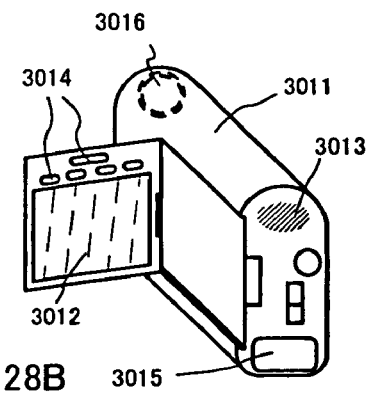

FIG. 28B is a video camera as an example according to the invention, and the video camcorder is constituted by a body 3011, a display portion 3012 and a sound input portion 3013, operating switches 3014, a battery 3015 and an image receiving portion 3016. A produced TFT substrate according to the invention is applied to the display portion 3012, and the video camera can be completed by the invention.

Figure 28C:
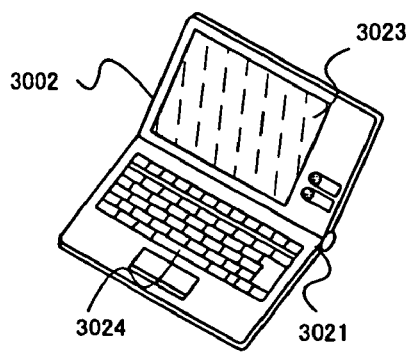

FIG. 28C is a note type of personal computer as an example according to the invention, and the personal computer is constituted by a body 3021, a support 3022, a display portion 3023 and a keyboard 3024. A produced TFT substrate according to the invention is applied to the display portion 3023, and the personal computer can be completed by the invention.

Figure 28D:
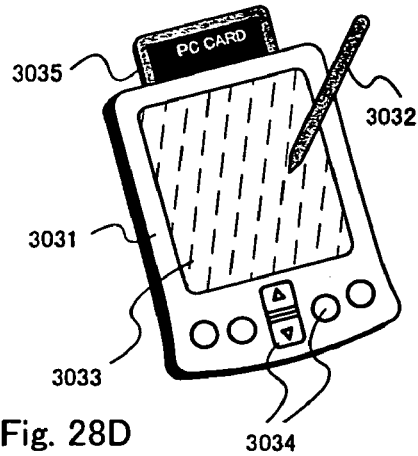

FIG. 28D is a PDA (Personal Digital Assistant) as an example according to the invention, and the PDA is constituted by a body 3031, a stylus 3032, a display portion 3033, operating buttons 3034 and an external interface 3035. A produced TFT substrate according to the invention is applied to the display portion 3033, and the personal computer can be completed by the invention.

Figure 28E:
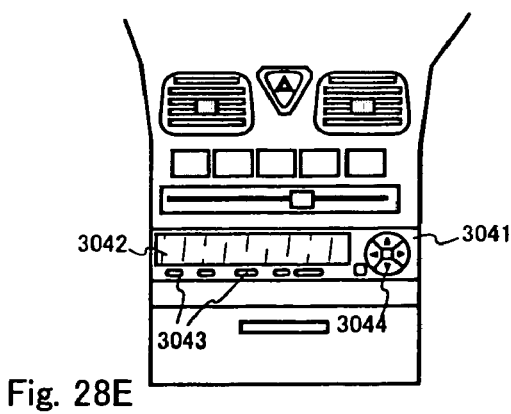

FIG. 28E is a sound reproducing system, concretely an on-vehicle audio system as an example according to the invention, and the audio system includes a body 3041, a display portion 3042 and operating switches 3043 and 3044. A produced TFT substrate according to the invention is applied to the display portion 3042, and the audio system can be completed by the invention.

Figure 28F:
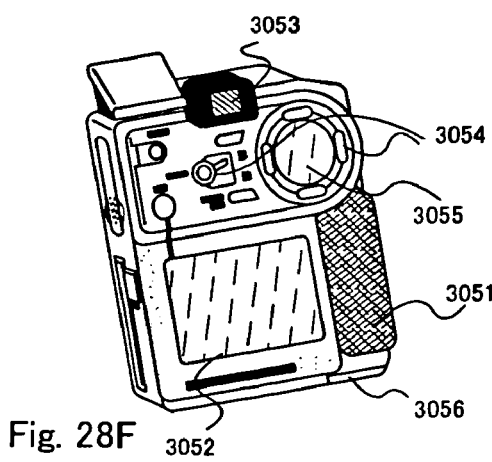

FIG. 28F is a digital camera as an example according to the invention, and the digital camera is constituted by a body 3051, a display portion A 3052 and an eyepiece portion 3053, operating switches 3054, a display portion B 3055 and a battery 3056. A produced TFT substrate according to the invention is applied to the display portion A 3052 and the display portion B 3055, and the digital camera can be completed by the invention.

Figure 28G:
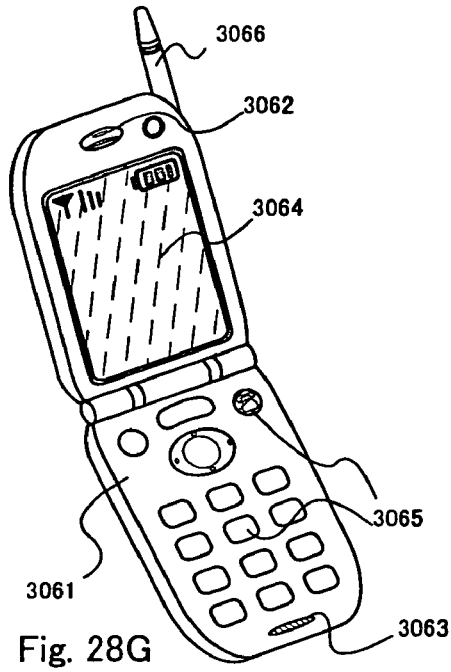

FIG. 28G is a cellular phone as an example according to the invention, and the cellular phone is constituted by a body 3061, a sound output portion 3062, a sound input portion 3063, a display portion 3064, operating switches 3065 and an antenna 3066. A produced TFT substrate according to the invention is applied to the display portion 3064, and the cellular phone can be completed by the invention.

Figure 29A:
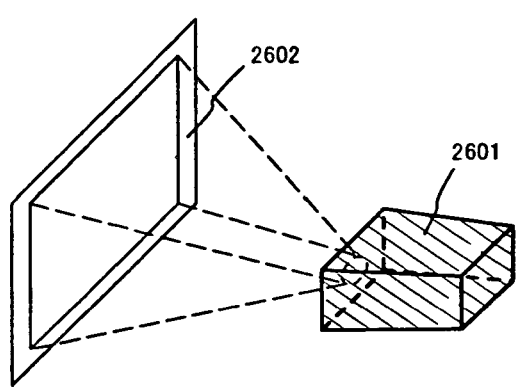
FIGS. 29A-29D are examples of an electronic apparatus which is provided with a semiconductor device according to the invention.
Figure 29B:
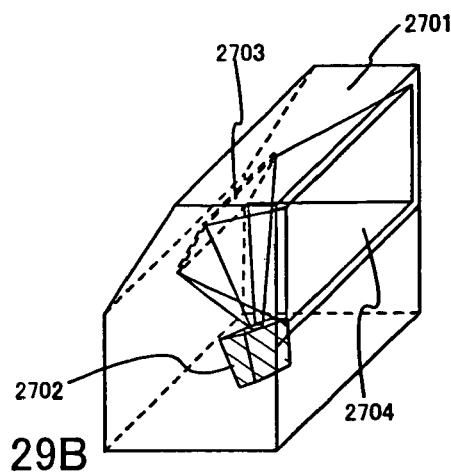

FIG. 29A is a front type of projector, which includes a projection apparatus 2601 and a screen 2602. FIG. 29B is a rear type of projector, which includes a body 2701, a projection apparatus 2702, a mirror 2703 and a screen 2704.

Figure 29C:
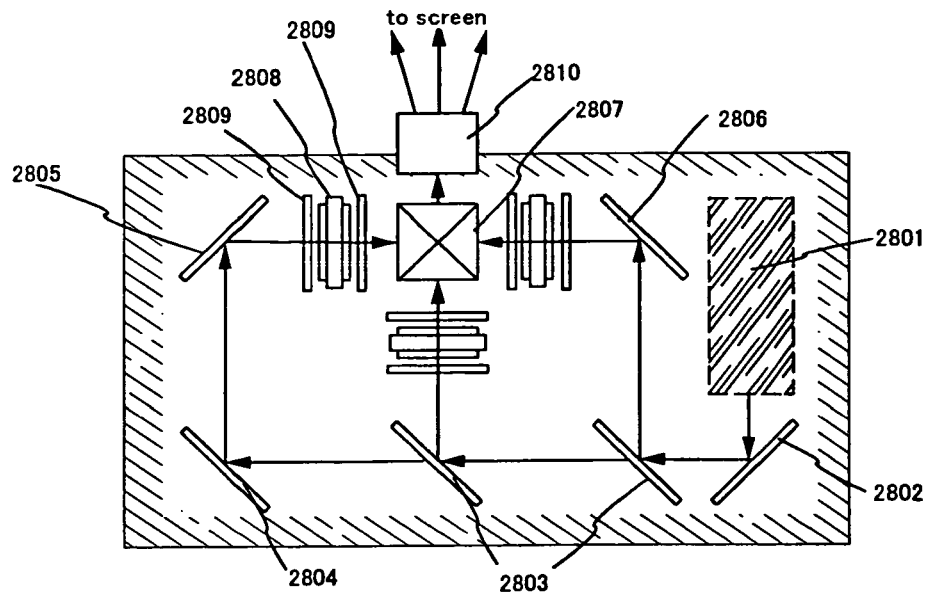

FIG. 29C shows an example of configuration of the projection apparatuses 2601 and 2702 illustrated in FIG. 29A and FIG. 29B. The projection apparatuses 2601 and 2702 are constituted by a light source optical system 2801, mirrors 2802 and 2804 to 2806, a dichroic mirror 2803, a prism 2807, a liquid crystal display apparatus 2808, a phase difference plate 2809 and projection optical system 2810. The projection optical system 2810 is constituted by an optical system including a projection lens. A single plate method may be applicable. Though the example of three plates is shown in the embodiment, there is no particular limitation. An optical system such as an optical lens, a film having polarization function, a film adjusting phase difference and an IR film may be properly provided in a light path shown by arrows in FIG. 29C.

Figure 29D:
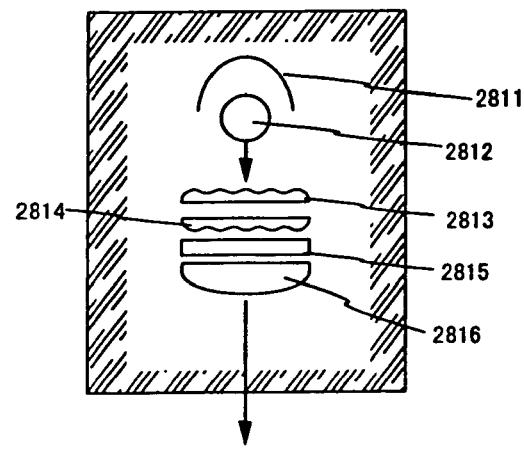

FIG. 29D shows an example of configuration of the light source optical system 2801 illustrated in FIG. 29C. In the embodiment, the light source optical system 2801 includes a reflector 2811, a light source 2812, lens arrays 2813 and 2814, a polarization conversion element 2815 and a condenser lens 2816. The light source optical system shown in FIG. 29D is an example, however there is no particular limitation. An optical system such as an optical lens, a film having polarization function, a film adjusting phase difference and an IR film may be properly provided in the light source optical system.

Figure 30:
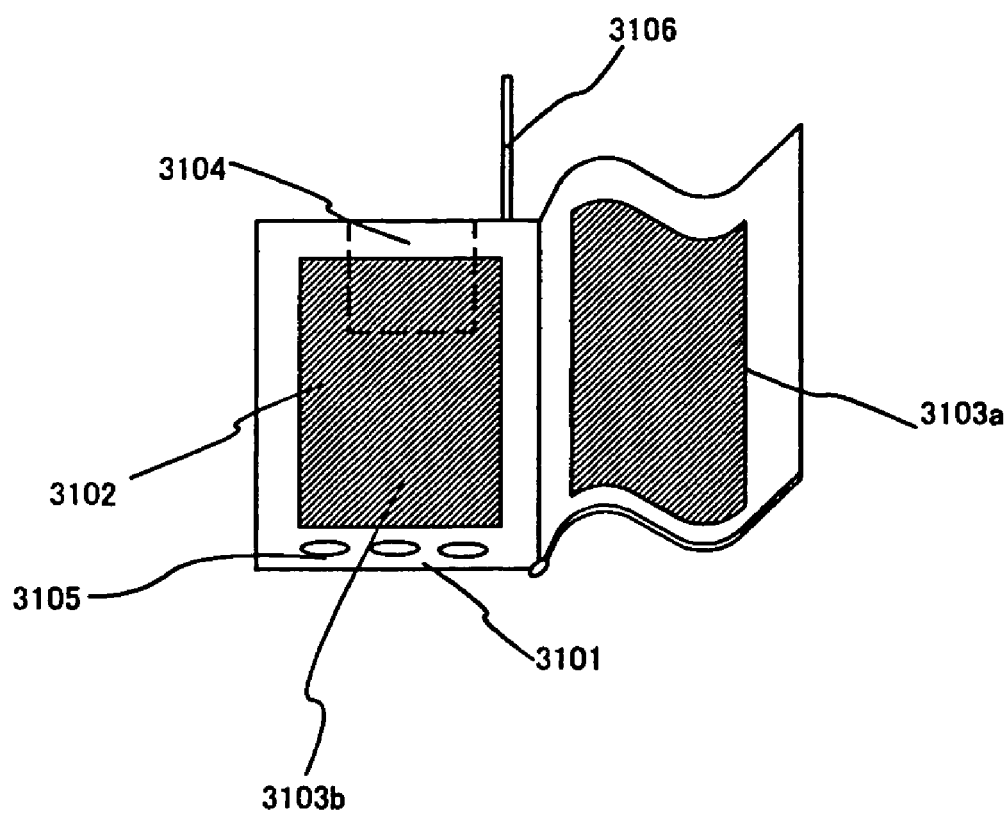
FIG. 30 is an example of an electronic apparatus which is provided with a semiconductor device according to the invention.

FIG. 30 is an electronic book, which is constituted by a body 3101, a display portion A 3102, a display portion B 3103, a memory medium 3104, operating switches 3105 and an antenna 3106. An electronic ink display can be applicable to the display portion B 3103. Driving circuits and pixel portions of the display portion A 3102 and the display portion B 3103 can be formed by the TFT substrate according to the invention. The electronic book can be completed by the invention.

Electronic apparatus illustrated in this specification is an example, therefore the invention is applicable particularly, but not exclusively, to those examples.

As described above, according to the invention, a first semiconductor region is formed, and crystal orientation becomes single orientation in a manner that a scanning direction of a continuous wave laser beam and a channel length direction of TFT are arranged in the same direction, which permits electrical field effect mobility to be improved. A seed crystal having a controlled crystal face is provided in a seed region, which enables a second semiconductor region having single orientation to be formed. This permits dispersion of film quality of gate insulating film formed on the second semiconductor to be eliminated and dispersion of threshold voltage to be reduced in a top gate type of TFT.

What is claimed is:

1. A method for manufacturing a semiconductor device comprising:
   forming a semiconductor region comprising silicon over a substrate;
   forming a barrier film covering the semiconductor region;
   forming a heat retaining film over the barrier film so that the heat retaining film covers top surface and side surfaces of the semiconductor region through the barrier film;
   after forming the heat retaining film, crystallizing the semiconductor region by scanning a laser beam from one edge to another of the semiconductor region from the substrate side;
   after crystallizing the semiconductor region, removing the heat retaining film and the barrier film; and
   after removing the heat retaining film, etching the semiconductor region in a manner that a scanning direction of the laser beam and a channel length direction of a thin film transistor are arranged in the same direction.

2. The method for manufacturing a semiconductor device according to claim 1, wherein the scanning the laser beam comprises a plurality of overlapped laser beams on the substrate.

3. The method for manufacturing a semiconductor device according to claim 1, wherein a wavelength of the laser beam is in the range of 400 to 700 nm.

4. The method for manufacturing a semiconductor device according to claim 1, wherein harmonics of the laser beam radiated from a solid state laser oscillation apparatus is used.

5. The method for manufacturing a semiconductor device according to claim 1, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

6. The method for manufacturing a semiconductor device according to claim 1, wherein the laser beam is irradiated obliquely to a normal of the substrate.

7. The method for manufacturing a semiconductor device according to claim 1, wherein the laser beam is continuous wave.

8. A method for manufacturing a semiconductor device comprising:
   forming a semiconductor region comprising silicon over a substrate;
   forming a barrier film covering the semiconductor region;
   forming a heat retaining film over the barrier film so that the heat retaining film covers top surface and side surfaces of the semiconductor region through the barrier film;
   after forming the heat retaining film, crystallizing the semiconductor region by scanning a laser beam from one edge to another of the semiconductor region from the substrate side;
   after crystallizing the semiconductor region, removing the heat retaining film;
   after removing the heat retaining film, forming an amorphous semiconductor film over the semiconductor region;
   after forming the amorphous semiconductor film, segregating a metallic element included in the semiconductor region to the amorphous semiconductor film by heat treatment;
   after segregating the metallic element, removing the amorphous semiconductor film and the barrier film; and
   after removing the amorphous semiconductor film, etching the semiconductor region in a manner that a scanning direction of the laser beam and a channel length direction of a thin film transistor are arranged in the same direction.

9. The method for manufacturing a semiconductor device according to claim 8, wherein the scanning the laser beam comprises a plurality of overlapped laser beams on the substrate.

10. The method for manufacturing a semiconductor device according to claim 8, wherein a wavelength of the laser beam is in the range of 400 to 700 nm.

11. The method for manufacturing a semiconductor device according to claim 8, wherein harmonics of the laser beam radiated from a solid state laser oscillation apparatus is used.

12. The method for manufacturing a semiconductor device according to claim 8, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

13. The method for manufacturing a semiconductor device according to claim 8, wherein the laser beam is irradiated obliquely to a normal of the substrate.

14. The method for manufacturing a semiconductor device according to claim 8, wherein the laser beam is continuous wave.

15. A method for manufacturing a semiconductor device comprising:
   forming an amorphous semiconductor film comprising silicon over a substrate;
   adding a catalytic element to the amorphous semiconductor film;
   heating the amorphous semiconductor film to form a crystalline semiconductor film;
   forming a semiconductor region by etching the crystalline semiconductor film;
   forming a barrier film covering the semiconductor region;
   forming a heat retaining film over the barrier film so that the heat retaining film covers top surface and side surfaces of the semiconductor region through the barrier film;
   after forming the heat retaining film, scanning a laser beam from one edge to another of the semiconductor region from the substrate side in order to improve crystalline characteristics of the semiconductor region;
   after scanning the laser beam, removing the heat retaining film and the barrier film; and
   after removing the heat retaining film, etching the semiconductor region in a manner that a scanning direction of the laser beam and a channel length direction of a thin film transistor are arranged in the same direction.

16. The method for manufacturing a semiconductor device according to claim 15, wherein after scanning the laser beam, the heat retaining film is removed and gettering treatment is performed for removing the catalytic element.

17. The method for manufacturing a semiconductor device according to claim 15, wherein the scanning the laser beam comprises a plurality of overlapped laser beams on the substrate.

18. The method for manufacturing a semiconductor device according to claim 15, wherein a wavelength of the laser beam is in the range of 400 to 700 nm.

19. The method for manufacturing a semiconductor device according to claim 15, wherein harmonics of the laser beam radiated from a solid state laser oscillation apparatus is used.

20. The method for manufacturing a semiconductor device according to claim 15, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

21. The method for manufacturing a semiconductor device according to claim 15, wherein the laser beam is irradiated obliquely to a normal of the substrate.

22. The method for manufacturing a semiconductor device according to claim 15, wherein the laser beam is continuous wave.

23. A method for manufacturing a semiconductor device comprising:
   forming an amorphous semiconductor film comprising silicon over a substrate;
   selectively adding a catalytic element to the amorphous semiconductor film;
   heating the amorphous semiconductor film to form a crystalline semiconductor film, wherein the amorphous semiconductor film is crystallized in a direction parallel to the substrate from a region where the catalytic element was selectively added;
   forming a semiconductor region by etching the crystalline semiconductor film;
   forming a barrier film covering the semiconductor region;
   forming a heat retaining film over the barrier film so that the heat retaining film covers top surface and side surfaces of the semiconductor region through the barrier film;
   after forming the heat retaining film, scanning a laser beam from one edge to another of the semiconductor region from the substrate side in order to improve crystalline characteristics of the semiconductor region;
   after scanning the laser beam, removing the heat retaining film and the barrier film; and
   after removing the heat retaining film, etching the semiconductor region in a manner that a scanning direction of the laser beam and a channel length direction of a thin film transistor are arranged in the same direction.

24. The method for manufacturing a semiconductor device according to claim 23, wherein after scanning the laser beam, the heat retaining film is removed and gettering treatment is performed for removing the catalytic element.

25. The method for manufacturing a semiconductor device according to claim 23, wherein the scanning the laser beam comprises a plurality of overlapped laser beams on the substrate.

26. The method for manufacturing a semiconductor device according to claim 23, wherein a wavelength of the laser beam is in the range of 400 to 700 nm.

27. The method for manufacturing a semiconductor device according to claim 23, wherein harmonics of the laser beam radiated from a solid state laser oscillation apparatus is used.

28. The method for manufacturing a semiconductor device according to claim 23, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

29. The method for manufacturing a semiconductor device according to claim 23, wherein the laser beam is irradiated obliquely to a normal of the substrate.

30. The method for manufacturing a semiconductor device according to claim 23, wherein the laser beam is continuous wave.

31. A method for manufacturing a semiconductor device comprising:
   forming a first amorphous semiconductor film over a substrate;
   adding a catalytic element to the first amorphous semiconductor film;
   heating the first amorphous semiconductor film to form a crystalline semiconductor film;
   forming a seed crystal region by etching the crystalline semiconductor film;
   forming a second amorphous semiconductor film comprising silicon over the substrate, overlapping with the seed crystal region,
   etching the second amorphous semiconductor film to form a semiconductor region overlapping with the seed crystal region at least partly;
   forming a barrier film covering the semiconductor region;
   forming a heat retaining film over the barrier film so that the heat retaining film covers top surface and side surfaces of the semiconductor region through the barrier film;
   after forming the heat retaining film, crystallizing the semiconductor region by scanning a laser beam from one edge overlapping with the seed crystal region to another of the semiconductor region from the substrate side;
   after crystallizing the semiconductor region, removing the heat retaining film and the barrier film; and
   after removing the heat retaining film, etching the semiconductor region and the seed crystal region in a manner that a scanning direction of the laser beam and a channel length direction of a thin film transistor are arranged in the same direction.

32. The method for manufacturing a semiconductor device according to claim 31, wherein after crystallizing the semiconductor region, the heat retaining film is removed and gettering treatment is performed for removing the catalytic element.

33. The method for manufacturing a semiconductor device according to claim 31, wherein the scanning the laser beam comprises a plurality of overlapped laser beams on the substrate.

34. The method for manufacturing a semiconductor device according to claim 31, wherein a wavelength of the laser beam is in the range of 400 to 700 nm.

35. The method for manufacturing a semiconductor device according to claim 31, wherein harmonics of the laser beam radiated from a solid state laser oscillation apparatus is used.

36. The method for manufacturing a semiconductor device according to claim 31, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

37. The method for manufacturing a semiconductor device according to claim 31, wherein the laser beam is irradiated obliquely to a normal of the substrate.

38. The method for manufacturing a semiconductor device according to claim 31, wherein the laser beam is continuous wave.

39. The method for manufacturing a semiconductor device according to claim 31, wherein the seed crystal region has a shape projected from the semiconductor region.

40. A method for manufacturing a semiconductor device comprising:
   forming a first amorphous semiconductor film containing silicon and germanium over a substrate;
   adding a catalytic element to the first amorphous semiconductor film;
   heating the first amorphous semiconductor film to form a crystalline semiconductor film;
   forming a seed crystal region by etching the crystalline semiconductor film;
   forming a second amorphous semiconductor film comprising silicon over the substrate, overlapping with the seed crystal region;
   etching the second amorphous semiconductor film to form a semiconductor region overlapping with the seed crystal region at least partly;
   forming a barrier film covering the semiconductor region;
   forming a heat retaining film over the barrier film so that the heat retaining film covers top surface and side surfaces of the semiconductor region through the barrier film;
   after forming the heat retaining film, crystallizing the semiconductor region by scanning a laser beam from one edge to another of the semiconductor region through the substrate;
   after crystallizing the semiconductor region, removing the heat retaining film and the barrier film; and
   after removing the heat retaining film, etching the semiconductor region and the seed crystal region in a manner that a scanning direction of the laser beam and a channel length direction of a thin film transistor are arranged in the same direction.

41. The method for manufacturing a semiconductor device according to claim 40, wherein after crystallizing the semiconductor region, the heat retaining film is removed and gettering treatment is performed for removing the catalytic element.

42. The method for manufacturing a semiconductor device according to claim 40, wherein the scanning the laser beam comprises a plurality of overlapped laser beams on the substrate.

43. The method for manufacturing a semiconductor device according to claim 40, wherein a wavelength of the laser beam is in the range of 400 to 700 nm.

44. The method for manufacturing a semiconductor device according to claim 40, wherein harmonics of the laser beam radiated from a solid state laser oscillation apparatus is used.

45. The method for manufacturing a semiconductor device according to claim 40, wherein the semiconductor device is incorporated into an electronic apparatus selected from the group consisting of a television set, a video camera, a note type of personal computer, a Personal Digital Assistant, a sound reproducing system, a digital camera, a cellular phone, a front type of projector, a rear type of projector, and a electronic book.

46. The method for manufacturing a semiconductor device according to claim 40, wherein the laser beam is irradiated obliquely to a normal of the substrate.

47. The method for manufacturing a semiconductor device according to claim 40, wherein the laser beam is continuous wave.

48. The method for manufacturing a semiconductor device according to claim 40, wherein the seed crystal region has a shape projected from the semiconductor region.

* * * * *